United States Patent
Mukherjee et al.

(10) Patent No.: US 12,143,114 B2
(45) Date of Patent: Nov. 12, 2024

(54) DIGITAL-TO-TIME CONVERTER (DTC) HAVING A PRE-CHARGE CIRCUIT FOR REDUCING JITTER

(71) Applicant: Texas Instruments Incorporated, Dallas, TX (US)

(72) Inventors: Subhashish Mukherjee, Bangalore (IN); Yogesh Darwhekar, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 18/081,028

(22) Filed: Dec. 14, 2022

(65) Prior Publication Data

US 2024/0137031 A1 Apr. 25, 2024
US 2024/0235564 A9 Jul. 11, 2024

(30) Foreign Application Priority Data

Oct. 25, 2022 (IN) .............................. 202241060758

(51) Int. Cl.
*H03K 21/00* (2006.01)
*H03K 21/02* (2006.01)
*H03M 1/06* (2006.01)

(52) U.S. Cl.
CPC ........ *H03M 1/0604* (2013.01); *H03K 21/026* (2013.01)

(58) Field of Classification Search
CPC ...... H03M 1/0604; H03M 1/82; H03M 1/825; H03M 1/0607; H03K 21/026
See application file for complete search history.

(56) References Cited

U.S. PATENT DOCUMENTS

| | | | |
|---|---|---|---|
| 9,362,936 B1* | 6/2016 | Caffee | H03K 5/135 |
| 10,855,294 B2 | 12/2020 | Haroun et al. | |
| 11,177,819 B1* | 11/2021 | Wu | H03K 5/24 |
| 11,500,336 B1* | 11/2022 | Darwhekar | H03K 5/131 |
| 2018/0131378 A1* | 5/2018 | Haroun | H03K 5/135 |
| 2018/0269895 A1* | 9/2018 | Kim | G04F 10/005 |
| 2022/0182065 A1* | 6/2022 | Wu | H03K 5/24 |
| 2023/0013907 A1* | 1/2023 | Mukherjee | H03M 1/1033 |

OTHER PUBLICATIONS

U.S. Appl. No. 17/377,698, filed Jul. 16, 2021.
U.S. Appl. No. 17/541,781, filed Dec. 3, 2021.
U.S. Appl. No. 17/956,576, filed Sep. 29, 2022.

* cited by examiner

*Primary Examiner* — Tuan T Lam

(74) *Attorney, Agent, or Firm* — John R. Pessetto; Frank D. Cimino

(57) ABSTRACT

A digital-to-time converter (DTC) circuit. The DTC circuit includes a charge node. A variable current source has a source input and a source output. The source input is coupled to a DTC digital input and the source output is coupled to the charge node. A capacitor has a first capacitor electrode and a second capacitor electrode. The first capacitor electrode is coupled to the charge node. A comparator has a first comparator input, a second comparator input, and a comparator output. The first comparator input is coupled to the charge node, the second comparator input is coupled to a reference voltage terminal, and the comparator output is coupled to a DTC output. A pre-charge circuit has a pre-charge control input and a pre-charge output. The pre-charge control input is coupled to a DTC pre-charge input and the pre-charge output is coupled to the capacitor.

20 Claims, 16 Drawing Sheets

DIGITAL-TO-TIME CONVERTER (DTC) HAVING A PRE-CHARGE CIRCUIT FOR REDUCING JITTER

REFERENCE TO RELATED APPLICATION

This application claims the benefit of India Provisional Application No. 202241060758, filed on Oct. 25, 2022, the contents of which are hereby incorporated by reference in their entirety.

BACKGROUND

A fractional output divider (FOD) is a circuit that takes an input clock signal and generates an output signal that is a fractionally divided version (e.g., a version that has a frequency that is a fraction of the frequency of the input signal) of the input clock signal. Fractional output dividers are used for applications that require a timing signal to operate, such as a microcontroller, a radio, a clock, etc. Such applications may require precise timing signals for operation and, thus, the fractional output divider needs to generate the output signal with low jitter and high accuracy. Some fractional output dividers include digital-to-time converters (DTCs). A DTC is a circuit that takes a digital input signal and generates a time delayed signal based on the digital input signal.

SUMMARY

In one example, a digital-to-time converter (DTC) circuit includes a charge node, a variable current source, a capacitor, a comparator, and a pre-charge circuit. The variable current source has a source input and a source output. The source input is coupled to a DTC digital input and the source output is coupled to the charge node. The capacitor has a first capacitor electrode and a second capacitor electrode. The first capacitor electrode is coupled to the charge node. The comparator has a first comparator input, a second comparator input, and a comparator output. The first comparator input is coupled to the charge node, the second comparator input is coupled to a reference voltage terminal, and the comparator output is coupled to a DTC output. The pre-charge circuit has a pre-charge control input and a pre-charge output. The pre-charge control input is coupled to a DTC pre-charge input and the pre-charge output is coupled to the capacitor.

In one example, a fractional output divider (FOD) circuit includes an integer divider circuit having a first divider input, a second divider input, and a first divider output. The first divider input is coupled to a FOD clock input. A modulator circuit has a first modulator input, a first modulator output, and a second modulator output. The first modulator input is coupled to a FOD digital input and the first modulator output is coupled to the second divider input. A digital-to-time converter (DTC) circuit has a DTC digital input, a DTC pre-charge input, and a DTC output. The DTC digital input is coupled to the second modulator output and the DTC pre-charge input is coupled to the first divider output. The DTC includes a charge node, a variable current source, a capacitor, a comparator, and a pre-charge circuit. The variable current source has a source input and a source output. The source input is coupled to the DTC digital input and the source output is coupled to the charge node. The capacitor has a first capacitor electrode and a second capacitor electrode. The first capacitor electrode is coupled to the charge node. The comparator has a first comparator input, a second comparator input, and a comparator output. The first comparator input is coupled to the charge node, the second comparator input is coupled to a reference voltage terminal, and the comparator output is coupled to the DTC output. The pre-charge circuit has a pre-charge control input and a pre-charge output. The pre-charge control input is coupled to the DTC pre-charge input and the pre-charge output is coupled to the capacitor.

In one example, a method includes receiving a digital input signal at a digital-to-time converter (DTC) digital input. The digital input signal corresponds to a digital value. A first capacitor is charged with a current during a first period of time to generate a first voltage ramp at a first electrode of the first capacitor. A magnitude of the current during the first period of time corresponds to the digital input signal. The first electrode of the first capacitor is coupled to an input of a comparator. The first capacitor is charged with the current during a second period of time to generate a second voltage ramp at the first electrode of the first capacitor. The magnitude of the current during the second period of time is independent of the digital input signal. The first capacitor is discharged during a third period of time. A second capacitor is charged with a pre-charge current during the third period of time to generate a positive pre-charge voltage at a first electrode of the second capacitor. A second electrode of the second capacitor is coupled to the input of the comparator during a fourth period of time to generate a negative pre-charge voltage at the input of the comparator during the fourth period of time.

BRIEF DESCRIPTION OF THE DRAWINGS

The same reference numbers or other reference designators are used in the drawings to designate the same of similar (functionally and/or structurally) features.

DETAILED DESCRIPTION

Figure 1:
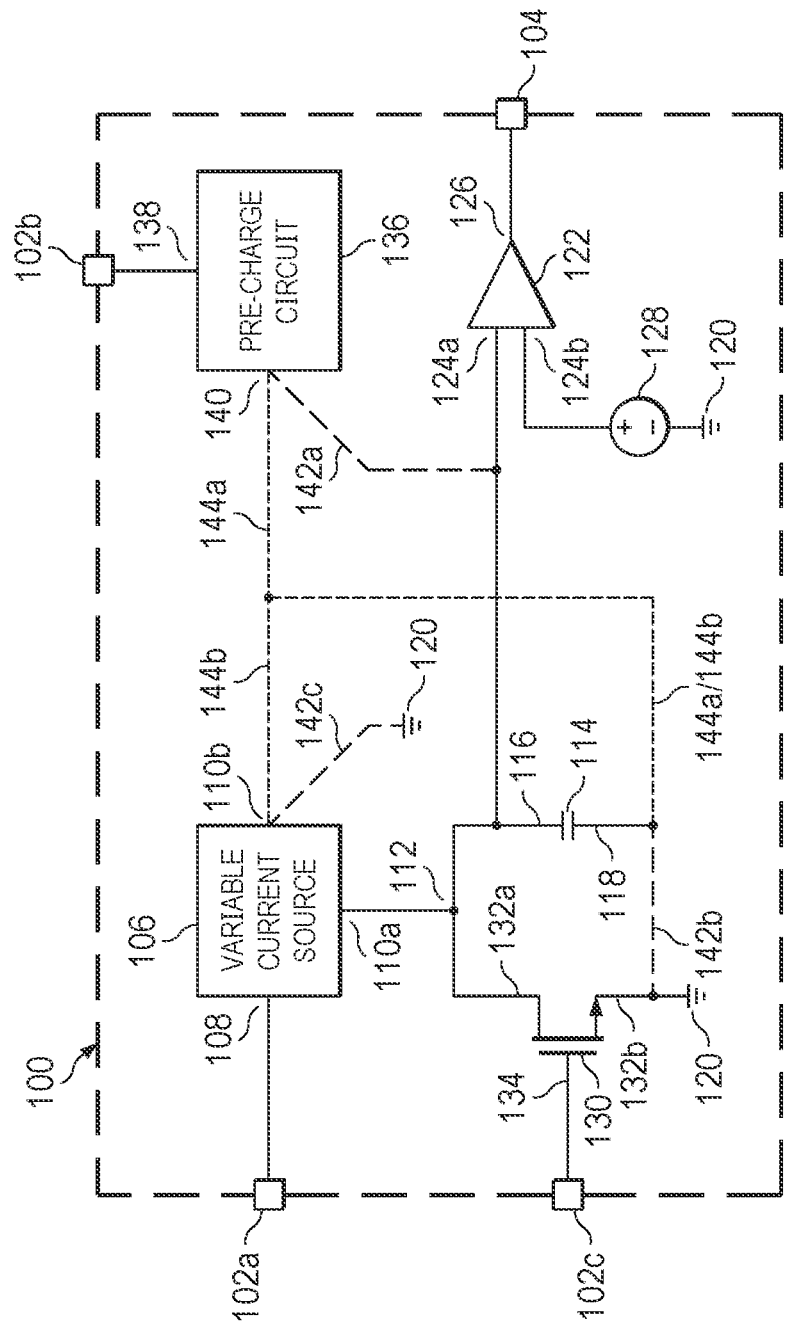
FIG. 1 is a circuit diagram of a digital-to-time converter (DTC) circuit including a pre-charge circuit.

The drawings are not necessarily to scale. Generally, the same reference numbers (or other reference designators) in the drawing(s) and this description refer to the same or similar (functionally and/or structurally) features.

Many modern devices include oscillators (e.g., bulk acoustic wave oscillators, crystal oscillators, or the like). Many oscillators are configured to generate a specific frequency. There is an increasing demand for oscillators that are capable of generating signals having a variety of frequencies according to a variable input. Some devices include a fractional output divider (FOD) coupled to an output of an oscillator. The FOD can generate a variable frequency signal from an oscillator output signal according to a variable input.

Some FODs may experience performance issues due to jitter, which can be described as the amount of deviation of a clock edge from its ideal location. Jitter often includes two components: deterministic jitter and random jitter. Deterministic jitter is predictable and/or repetitive while random jitter varies randomly. Some FODs include a digital-to-time converter (DTC) to reduce deterministic jitter. For example, a DTC can generate a delayed clock signal according to a desired delay. Thus, the DTC can compensate for and/or offset the deterministic jitter of the FOD by tuning the delay of the output clock signal to offset the deterministic jitter. However, random jitter remains a factor that affects the performance of the FOD.

In some devices, a DTC includes a variable current source, a capacitor, and a comparator. An output of the variable current source is coupled to the capacitor and a first input of the comparator. The variable current source is configured to provide current to the capacitor to charge the capacitor. In response, the capacitor is configured to provide a voltage ramp to the first input of the comparator. In some instances, the random jitter of a DTC is primarily affected by noise at the comparator, which is primarily affected by the slope of the voltage ramp at the first input of the comparator. For example, as the slope of the voltage ramp is reduced, the noise at the comparator is increased and thus the random jitter is increased. Conversely, as the slope of the voltage ramp is increased, the noise at the comparator is reduced and thus the random jitter is reduced.

In some examples, the slope of the voltage ramp can be increased by reducing the "run" of the voltage ramp (e.g., the ramp time) while maintaining the "rise" of the voltage ramp (e.g., the target voltage of the voltage ramp). However, the ramp time is restricted by the period of the input clock signal of the FOD. Thus, reducing the ramp time may not be feasible in many devices. In some other examples, the slope of the voltage ramp can be increased by increasing the "rise" of the voltage ramp by increasing the target voltage of the voltage ramp while maintaining the "run" of the voltage ramp (e.g., the ramp time). However, increasing the target voltage of the voltage ramp can reduce a linearity of the FOD which can increase the jitter of the FOD.

In various examples of the present disclosure, the DTC includes a pre-charge circuit coupled to the first input of the comparator for increasing the slope of the voltage ramp at the first input of the comparator by reducing the starting voltage of the voltage ramp. In particular, the pre-charge circuit is configured to generate a negative voltage at the first input of the comparator before the voltage ramp is provided to the first input of the comparator. Consequently, the voltage ramp will start at the negative voltage. By starting the voltage ramp at the negative voltage (instead of zero volts), the slope of the voltage ramp can be increased without reducing the ramp time and without increasing the target ramp voltage. By increasing the slope of the voltage ramp at the first input of the comparator, the noise at the comparator can be reduced and thus random jitter can be reduced.

FIG. 1 is a circuit diagram of a digital-to-time converter (DTC) circuit 100. The DTC 100 has a DTC digital input 102a, a DTC pre-charge input 102b, a DTC reset input 102c, and a DTC output 104. The DTC 100 includes a variable current source 106. The variable current source 106 has a source input 108, a first source output 110a, and a second source output 110b. The source input 108 is coupled to the DTC digital input 102a. The first source output 110a is coupled to a charge node 112.

A capacitor 114 is coupled to the charge node 112. The capacitor 114 has a first electrode 116 and a second electrode 118. The first electrode 116 is coupled to the charge node 112.

A comparator 122 is coupled to the charge node 112. The comparator 122 has a first comparator input 124a, a second comparator input 124b, and a comparator output 126. The first comparator input 124a is coupled to the charge node 112. The second comparator input 124b is coupled to a terminal of a reference voltage supply 128. In some examples, the reference voltage supply 128 is adjustable. The comparator output 126 is coupled to the DTC output 104.

A reset transistor 130 is coupled to the charge node 112. The reset transistor 130 has a first current terminal (e.g., a drain) 132a, a second current terminal (e.g., a source) 132b, and a control terminal (e.g., a gate) 134. The first current terminal 132a is coupled to the charge node 112. The second current terminal 132b is coupled to ground 120. The control terminal 134 is coupled to the DTC reset input 102c.

A pre-charge circuit 136 is coupled to the capacitor 114. For example, the pre-charge circuit 136 has a pre-charge control input 138 and a pre-charge output 140. The pre-charge control input 138 is coupled to the DTC pre-charge input 102b.

In some examples, the pre-charge output 140 is coupled to the first electrode 116 of the capacitor 114 (e.g., as illustrated by dashed connection 142a), the second electrode 118 of the capacitor 114 is coupled to ground 120 (e.g., as illustrated by dashed connection 142b), and the second source output 110b is coupled to ground 120 (e.g., as illustrated by dashed connection 142c). In some other examples, the pre-charge output 140 is coupled to the second electrode 118 of the capacitor 114 (e.g., as illustrated by dashed connection 144a) and the second source output 110b is coupled to the second electrode 118 of the capacitor 114 (e.g., as illustrated by dashed connection 144b).

Figure 2:
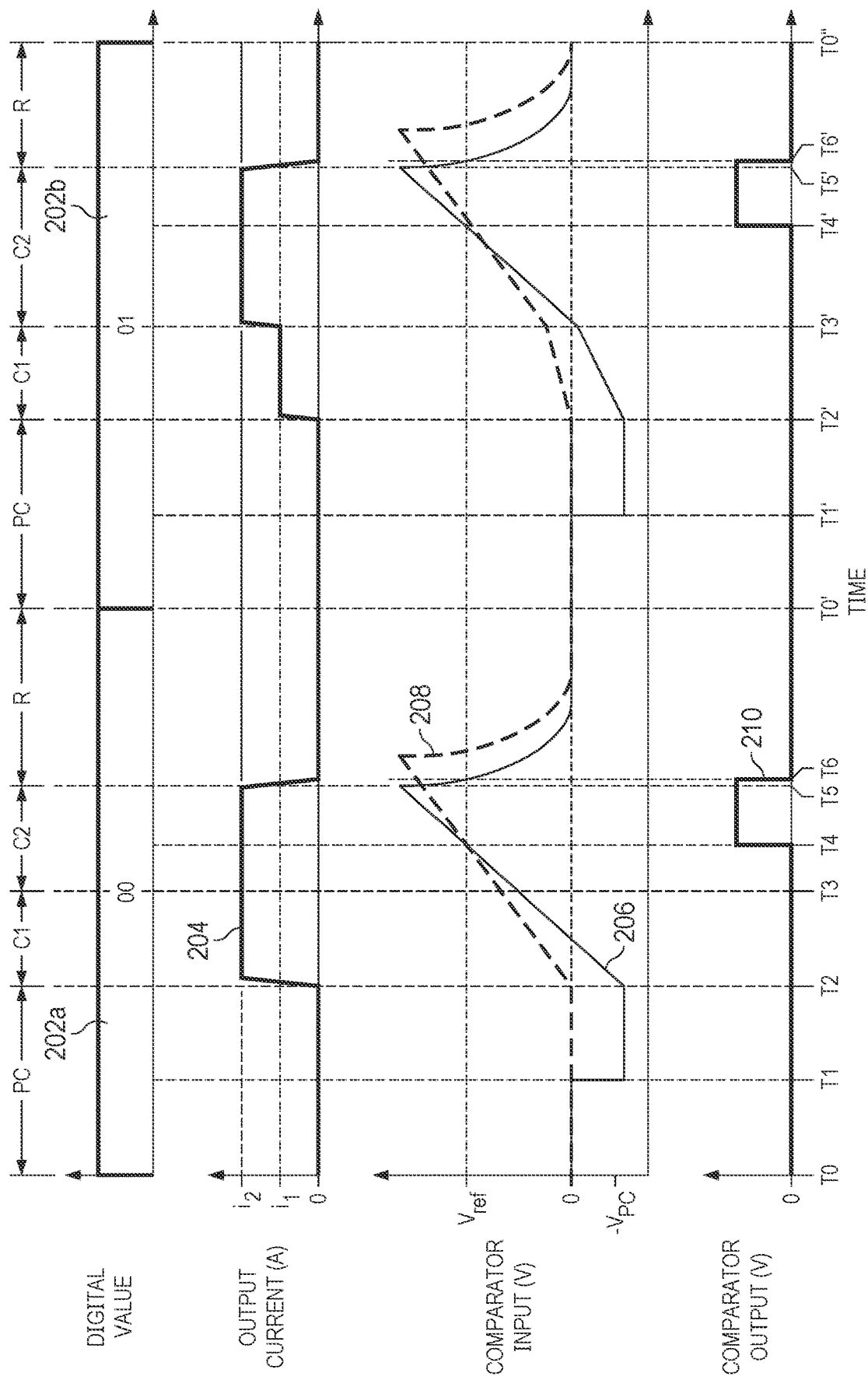
FIG. 2 is a timing diagram of an example operation of the DTC of FIG. 1.

FIG. 2 is a timing diagram of an example operation of the DTC 100 of FIG. 1. Referring to FIG. 2 and FIG. 1 together, the DTC 100 is configured to receive a digital DTC input signal (not shown) corresponding to a digital value (e.g., a bitstream, a binary value, or the like) at the DTC digital input 102a. The DTC 100 is configured to generate a time-delayed signal (e.g., 210) at the DTC output 104 based on the digital DTC input signal. Blocks 202a, 202b illustrate exemplary input digital values over time. In particular, in the example illustrated in FIG. 2, the digital value from time T0 to time T0' is 00 and the digital value from time T0' to time T0" is 01.

The variable current source 106 is configured to receive the digital DTC input signal (not shown) at the source input 108 from the DTC digital input 102a. The DTC 100 is configured to receive a pre-charge control signal (not shown) at the DTC pre-charge input 102b. The pre-charge circuit 136 is configured to receive the pre-charge control signal at the pre-charge control input 138 from the DTC pre-charge input 102b.

During a pre-charging phase PC (e.g., from time T0 to time T2 or from time T0' to time T2'), the pre-charge circuit 136 causes a negative pre-charge voltage $-V_{PC}$ (e.g., −200 millivolts or some other suitable value) to be generated at the first comparator input 124a according to the pre-charge control signal. For example, at time T1, the voltage at the first comparator input 124a (and the charge node 112) drops to the negative pre-charge voltage $-V_{PC}$.

After the negative pre-charge voltage $-V_{PC}$ is generated at the first comparator input 124a, the variable current source 106 is configured to generate a current at the first source output 110a. For example, during a first charging phase C1 (e.g., from time T2 to time T3 or from time T2' to time T3'), the variable current source 106 is configured to set the magnitude of the current based on the digital DTC input signal received at the source input 108. Signal 204 illustrates the current at the first source output 110a over time. The current is provided to the first electrode 116 of the capacitor 114 from the first source output 110a to charge the capacitor 114. In response, the capacitor 114 generates a voltage ramp at the first comparator input 124a. Signal 206 illustrates the voltage at the first comparator input 124a over time. The voltage ramp starts at the negative pre-charge voltage $-V_{PC}$. The slope of the voltage ramp at the first comparator input 124a during the first charging phase C1 is proportional to the magnitude of the current during the first charging phase C1. Thus, the slope of the voltage ramp during the first charging phase C1 corresponds to the digital DTC input signal. For example, when the digital DTC input signal corresponds to a first digital value (e.g., 00, as illustrated by block 202a), the voltage ramp will have a first slope during the first charging phase C1. When the digital DTC input signal corresponds to a second digital value (e.g., 01, as illustrated by block 202b), different from the first value, the voltage ramp will have a second slope, different than the first slope, during the first charging phase C1.

During a subsequent second charging phase C2 (e.g., from time T3 to time T5 or from time T3' to time T5'), the variable current source 106 is configured to set the magnitude of the current generated at the first source output 110a to a constant value that is independent of the digital DTC input signal. The slope of the voltage ramp at the first comparator input 124a during the second charging phase C2 is proportional to the magnitude of the current during the second charging phase C2. Thus, the slope of the voltage ramp during the second charging phase C2 is independent of the digital DTC input signal.

By including the pre-charge circuit 136 in the DTC, random jitter can be reduced (e.g., by around 30% or more). For example, because the pre-charge circuit 136 causes the negative pre-charge voltage $-V_{PC}$ to be generated at the first comparator input 124a before the capacitor 114 generates the voltage ramp at the first comparator input 124a, the voltage ramp starts from the negative pre-charge voltage $-V_{PC}$. Further, the minimum time required for the voltage at the first comparator input 124a to reach the reference voltage $V_{ref}$ (e.g., the minimum charging time) can be fixed, regardless of the starting voltage of the voltage ramp. Thus, by starting the first voltage ramp at the negative pre-charge voltage $-V_{PC}$ (instead of starting from 0 volts, as illustrated by baseline voltage signal 208), the slope of the voltage ramp during the first charging phase C1 and the second charging phase C2 can be increased (relative to slope of the voltage ramp starting at 0 volts, as illustrated by the baseline voltage signal 208). Increasing the slope of the voltage ramp at the first comparator input 124a reduces noise at the comparator 122. Reducing the noise at the comparator 122 reduces random jitter. Thus, by including the pre-charge circuit 136 in the DTC, random jitter can be reduced.

In response to the voltage at the first comparator input 124a (e.g., the non-inverting input or the "+" input) reaching and/or surpassing the reference voltage $V_{ref}$ (e.g., 300 millivolts or some other suitable value) at the second comparator input 124b (e.g., the inverting input or "−" input)(e.g., at time T4), a voltage at the at the comparator output 126 transitions from a low voltage state (e.g., 0 volts) to a high voltage state (e.g., some positive voltage). Signal 210 illustrates the voltage at the comparator output 126 over time. The rising edge of the voltage at the comparator output 126 is delayed based on the slope of the voltage ramp during the first charging phase C1 (which is based on the digital DTC input signal). For example, because the voltage ramp slope during the first charging phase C1 corresponding to the first digital value (e.g., 00) is greater than the voltage ramp slope during the first charging phase C1 corresponding to the second digital value (e.g., 01), the first rising edge of the voltage at the comparator output 126 (corresponding to the first digital value) is delayed (e.g., as measured from time T0) by a greater amount than the second rising edge (e.g., as measured from time T0') of the voltage at the comparator output 126 (corresponding to the second digital value). Thus, the DTC 100 generates a time-delayed signal (e.g., 210) based on the digital DTC input signal.

During a subsequent reset phase R (e.g., from time T5 to T0' or from time T5' to time T0"), the capacitor 114 is discharged. As a result, the voltage at the first comparator input 124a decreases to zero. In response to the voltage at the first comparator input 124a falling to and/or dropping below the reference voltage $V_{ref}$ (e.g., at time T6 or at time T6'), the voltage at the comparator output 126 transitions from the high voltage state to the low voltage state. The discharging of the capacitor 114 begins an amount of time after the comparator input voltage signal 206 has reached and/or surpassed the reference voltage $V_{ref}$ (e.g., at time T5 or at time T5').

The capacitor 114 is discharged by switching "on" the reset transistor 130 (e.g., by causing the reset transistor to conduct between current terminal 132a and current terminal 132b) so that the first electrode 116 is coupled to ground 120. For example, the DTC receives a reset signal (not shown) at the DTC reset input 102c. The reset transistor 130 receives the reset signal at the reset control terminal 134 from the DTC reset input 102c. In some examples, the variable current source 106 sets the magnitude of the current at the first source output 110a to zero after the reset transistor 130 is switched "on". After the reset phase R, the pre-charging phase PC begins again (e.g., at time T0'). In some examples, the reset transistor 130 remains "on" during a portion of the pre-charging phase PC (e.g., until time T1') to ensure the capacitor 114 discharges fully.

Figure 3:
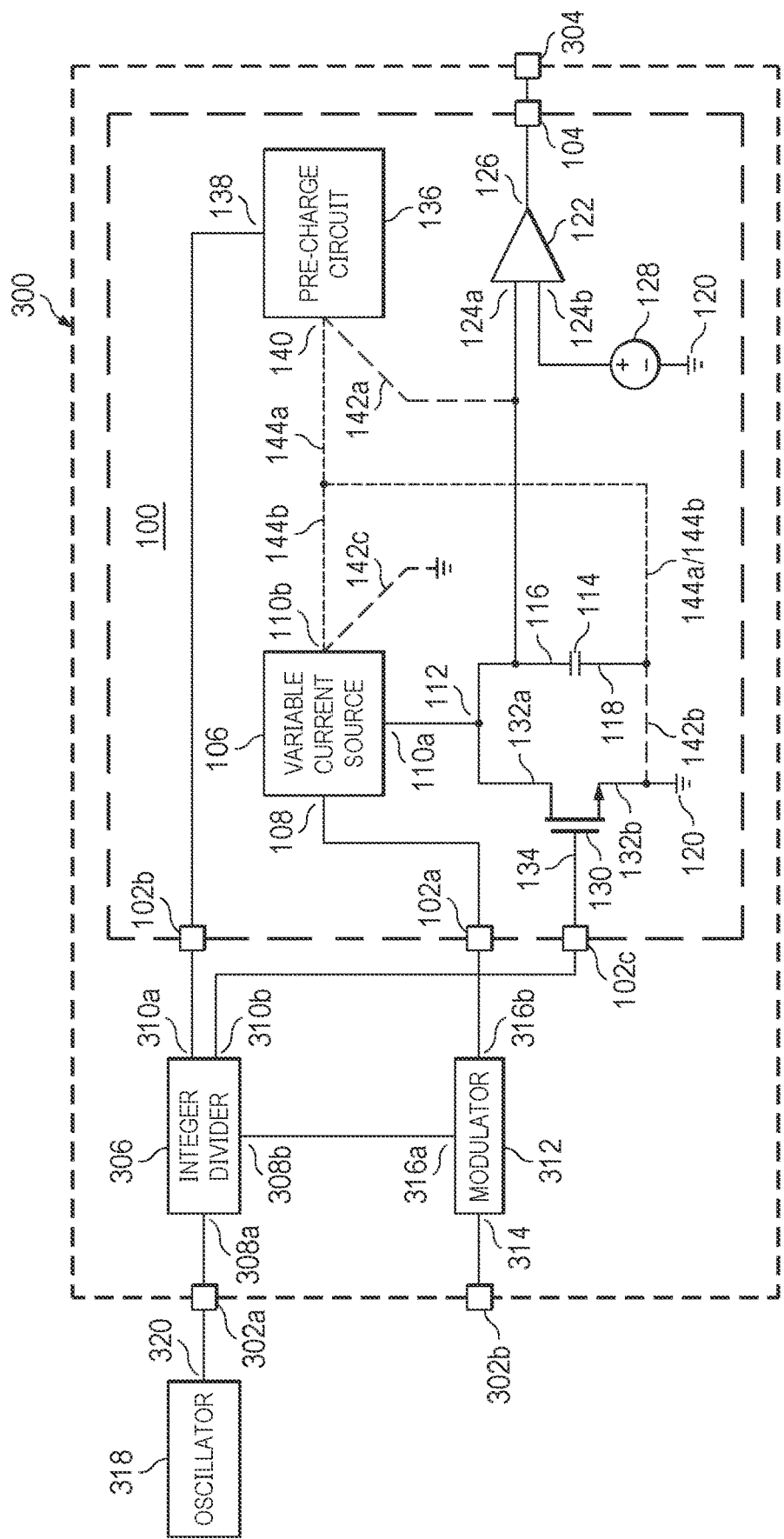
FIG. 3 is a circuit diagram of a fractional output divider (FOD) circuit including the DTC of FIG. 1.

FIG. 3 is a circuit diagram of a fractional output divider (FOD) circuit 300 including the DTC 100 of FIG. 1. The FOD 300 has an FOD clock input 302a, an FOD digital input 302b, and an FOD output 304. In some examples, the FOD clock input 302a is coupled to an oscillator 318 at an output 320 of the oscillator 318. The FOD output 304 is coupled to the DTC output 104.

The FOD 300 includes an integer divider circuit 306. The integer divider 306 has a first divider input 308a and a second divider input 308b. The first divider input 308a is coupled to the FOD clock input 302a. The integer divider 306 has a first divider output 310a (e.g., a divider pre-charge output) and a second divider output 310b (e.g., a divider reset output). The first divider output 310a is coupled to the DTC pre-charge input 102b. The second divider output 310b is coupled to the DTC reset input 102c.

A modulator circuit 312 (e.g., a delta sigma modulator circuit or the like) is coupled to the integer divider 306 and the DTC 100. The modulator circuit 312 has a modulator input 314, a first modulator output 316a, and a second modulator output 316b. The modulator input 314 is coupled to the FOD digital input 302b. The first modulator output 316a is coupled to the second divider input 308b. The second modulator output 316b is coupled to the DTC digital input 102a.

The first divider input 308a is configured to receive an input clock signal (e.g., 502 of FIG. 5) from the FOD clock input 302a. In some examples, the FOD clock input 302a is configured to receive the input clock signal at the FOD clock input 302a from the output 320 of the oscillator 318.

The modulator input 314 is configured to receive a digital FOD input signal from the FOD digital input 302b. In some examples, the FOD digital input 302b is coupled to digital control circuitry (not shown) and the FOD 300 is configured to receive the digital FOD input signal at the FOD digital input 302b from the digital control circuitry. The digital FOD input signal indicates a desired delay to the FOD 300.

The modulator 312 is configured to generate an integer k based on the digital FOD input signal and output the integer k at the first modulator output 316a. The modulator 312 is configured to generate the digital DTC input signal based on the digital FOD input signal, and output the digital DTC input signal at the second modulator output 316b.

The integer divider 306 is configured to receive the integer k from the modulator 312 at the second divider input 308b. The integer divider 306 is further configured to generate the pre-charge control signal and the reset signal based, at least in part, on the integer k. The integer divider 306 is configured to provide the pre-charge control signal to the DTC pre-charge input 102b via the first divider output 310a and provide the reset signal to the DTC reset input 102c via the second divider output 310b.

Figure 4:
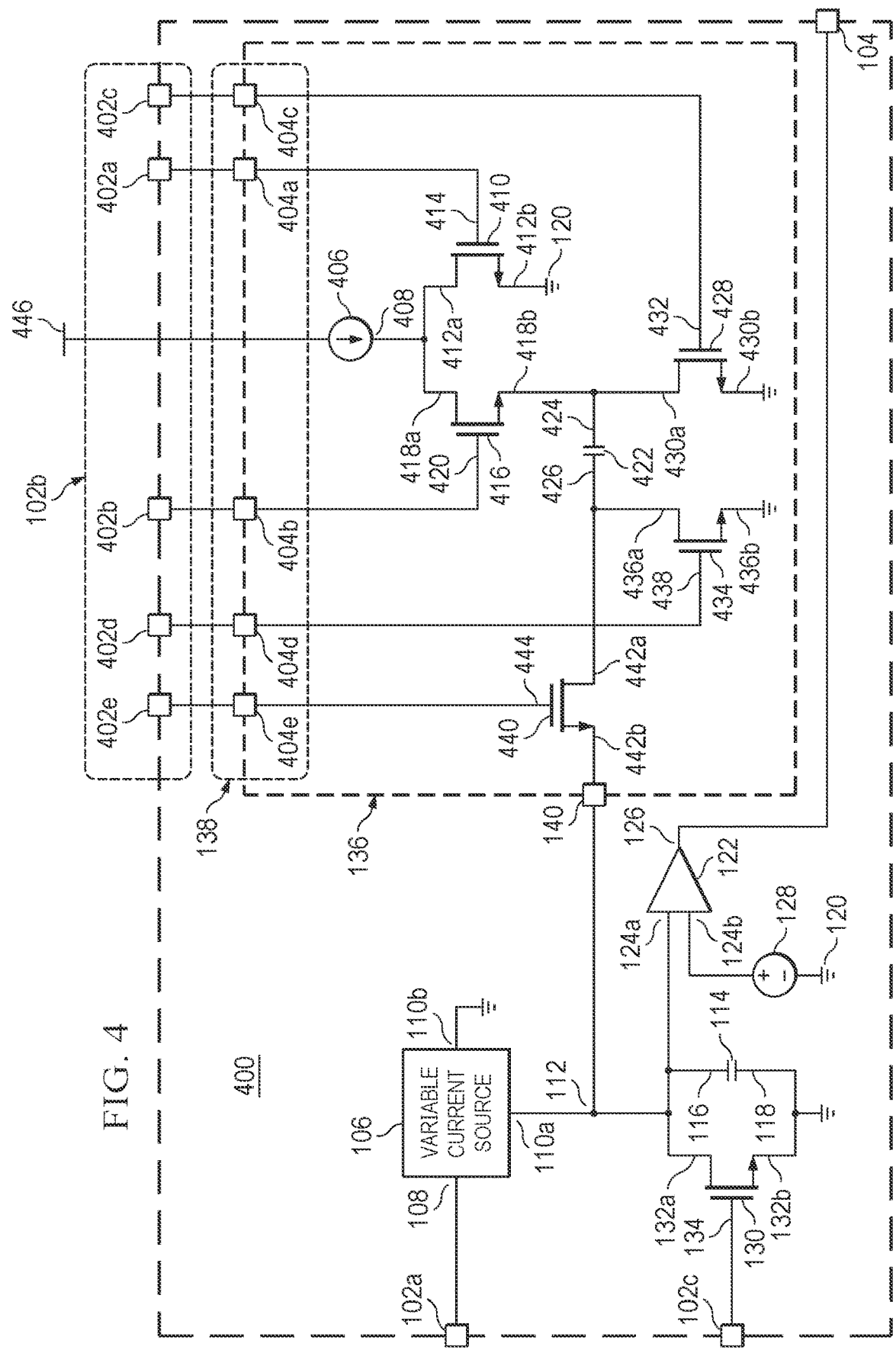
FIG. 4 is a circuit diagram of a DTC circuit.

FIG. 4 is a circuit diagram of a DTC circuit 400 similar to the DTC circuit 100 of FIG. 1. In the example illustrated in FIG. 4, the DTC pre-charge input 102b includes DTC input terminals 402a, 402b, 402c, 402d and 402e. Further, the pre-charge control input 138 includes pre-charge control input terminals 404a, 404b, 404c, 404d and 404e. DTC input terminals 402a-402e are coupled to pre-charge control input terminals 404a-404e, respectively.

The pre-charge circuit 136 includes a pre-charge current source 406 having a pre-charge source output 408. The pre-charge current source 406 is coupled to a voltage supply terminal 446. A first pre-charge transistor 410 is coupled to the pre-charge current source 406. In particular, the first pre-charge transistor 410 has a first current terminal (e.g., a source) 412a, a second current terminal (e.g., a drain) 412b, and a control terminal (e.g., a gate) 414. The first current terminal 412a of the first pre-charge transistor 410 is coupled to the pre-charge source output 408. The second current terminal 412b of the first pre-charge transistor 410 is coupled to ground 120. The control terminal 414 of the first pre-charge transistor 410 is coupled to pre-charge control input terminal 404a.

A second pre-charge transistor 416 is coupled to the pre-charge current source 406. In particular, the second pre-charge transistor 416 has a first current terminal (e.g., a source) 418a, a second current terminal (e.g., a drain) 418b, and a control terminal (e.g., a gate) 420. The first current terminal 418a of the second pre-charge transistor 416 is coupled to the pre-charge source output 408. The control terminal 420 of the second pre-charge transistor 416 is coupled to pre-charge control input terminal 404b.

A capacitor 422 (e.g., a second capacitor) is coupled to the second pre-charge transistor 416. In particular, capacitor 422 has a first electrode 424 and a second electrode 426. The first electrode 424 of capacitor 422 is coupled to the second current terminal 418b of the second pre-charge transistor 416. In some examples, the first electrode 424 of capacitor 422 may be referred to as a pre-charge node.

A third pre-charge transistor 428 is coupled to capacitor 422. In particular, the third pre-charge transistor 428 has a first current terminal (e.g., a drain) 430a, a second current terminal (e.g., a source) 430b, and a control terminal (e.g., a gate) 432. The first current terminal 430a of the third pre-charge transistor 428 is coupled to the first electrode 424 of capacitor 422. The second current terminal 430b of the third pre-charge transistor 428 is coupled to ground 120. The control terminal 432 of the third pre-charge transistor 428 is coupled to pre-charge control input terminal 404c.

A fourth pre-charge transistor 434 is coupled to capacitor 422. In particular, the fourth pre-charge transistor 434 has a first current terminal (e.g., a drain) 436a, a second current terminal (e.g., a source) 436b, and a control terminal (e.g., a gate) 438. The first current terminal 436a of the fourth pre-charge transistor 434 is coupled to the second electrode 426 of capacitor 422. The second current terminal 436b of the fourth pre-charge transistor 434 is coupled to ground 120. The control terminal 438 of the fourth pre-charge transistor 434 is coupled to pre-charge control input terminal 404d.

A fifth pre-charge transistor 440 is coupled to capacitor 422. In particular, the fifth pre-charge transistor 440 has a first current terminal (e.g., a drain) 442a, a second current terminal (e.g., a source) 442b, and a control terminal 444. The first current terminal 442a of the fifth pre-charge transistor 440 is coupled to the second electrode 426 of capacitor 422. The second current terminal 442b of the fifth pre-charge transistor 440 is coupled to the pre-charge output 140. The control terminal 444 of the fifth pre-charge transistor 440 is coupled to pre-charge control input terminal 404e.

The pre-charge output 140 is coupled to the first electrode 116 of capacitor 114 and the first comparator input 124a via the charge node 112. The second electrode 118 of capacitor 114 is coupled to ground 120. The second source output 110b is coupled to ground.

In some examples, the capacitance of capacitor 422 is directly proportional to the capacitance of capacitor 114. Further, in some examples, the maximum current provided by the pre-charge current source 406 is directly proportional to the maximum current provided by the variable current source 106. By setting the capacitances to be directly proportional and by setting the maximum currents to be directly proportional, the circuit's sensitivity to process and/or temperature variations can be reduced.

In some examples, the capacitance of capacitor 422 and the capacitance of capacitor 114 are on the order of picofarads and are adjustable (e.g., controllable). In some examples, adjusting the capacitance of capacitor 114 changes the slope of the voltage ramp generated by capacitor 114. Thus, the capacitance of capacitor 114 can be tuned to adjust the slope of the voltage ramp so that the minimum time required for the voltage ramp to reach the reference voltage $V_{ref}$ (e.g., the minimum charging time) can be maintained regardless of the starting voltage of the voltage ramp.

In some examples, the maximum output currents of the pre-charge current source 406 and the variable current source 106 are on the order of milliamps and are adjustable. In some examples, the maximum current of the pre-charge current source 406 and/or the capacitance of capacitor 422 can be tuned to control the negative pre-charge voltage $-V_{PC}$.

Figure 5:
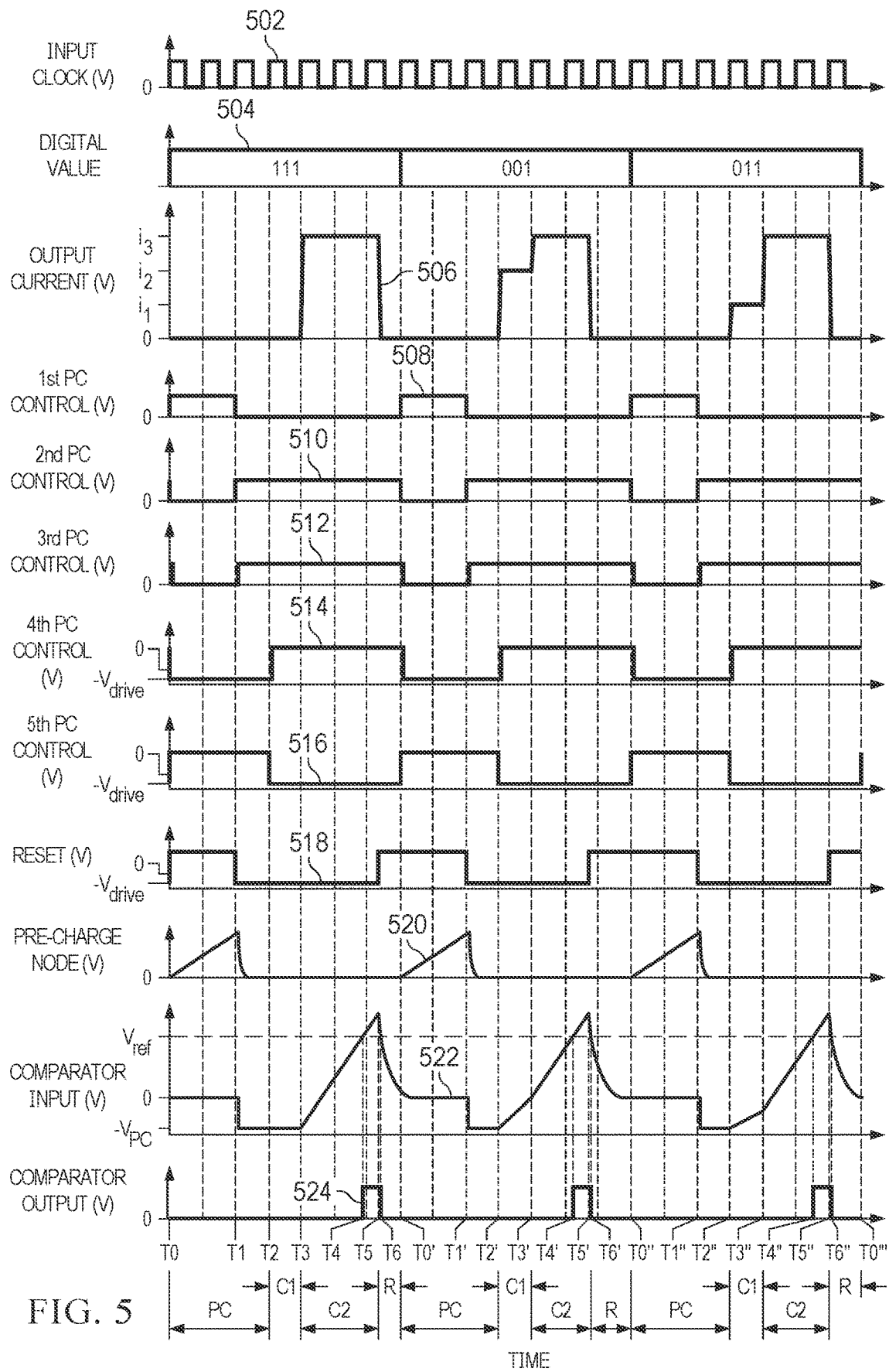
FIG. 5 is a timing diagram of the DTC of FIG. 4

DTC input terminal 402a is configured to receive a first pre-charge control signal (e.g., 508 of FIG. 5). The control terminal 414 of the first pre-charge transistor 410 is configured to receive the first pre-charge control signal from DTC input terminal 402a via pre-charge control input terminal 404a. DTC input terminal 402b is configured to receive a second pre-charge control signal (e.g., 510 of FIG. 5). The control terminal 420 of the second pre-charge transistor 416 is configured to receive the second pre-charge control signal from DTC input terminal 402b via pre-charge control input terminal 404b. DTC input terminal 402c is configured to receive a third pre-charge control signal (e.g., 512 of FIG. 5). The control terminal 432 of the third pre-charge transistor 428 is configured to receive the third pre-charge control signal from DTC input terminal 402c via pre-charge control input terminal 404c. DTC input terminal 402d is configured to receive a fourth pre-charge control signal (e.g., 514 of FIG. 5). The control terminal 438 of the fourth pre-charge transistor 434 is configured to receive the fourth pre-charge control signal from DTC input terminal 402d via pre-charge control input terminal 404d. DTC input terminal 402e is configured to receive a fifth pre-charge control signal (e.g., 516 of FIG. 5). The control terminal 444 of the fifth pre-charge transistor 440 is configured to receive the fifth pre-charge control signal from DTC input terminal 402e via pre-charge control input terminal 404e. The DTC reset input 102c is configured to receive the reset signal (e.g., 518 of FIG. 5). The reset control terminal 134 of the reset transistor 130 is configured to receive the reset signal from the DTC reset input 102c.

FIG. 5 is a timing diagram of the DTC 400 of FIG. 4. Referring to both FIG. 4 and FIG. 5, signal 502 illustrates an input clock signal received at the FOD clock input 302a (FIG. 3). Blocks 504 illustrate example digital values corresponding to an exemplary digital FOD input signal (not shown) received at the FOD digital input 302b (FIG. 3). Signal 506 illustrates the current at the first source output 110a. Signal 520 illustrates the voltage at the first electrode 424 of capacitor 422 over time (e.g., the pre-charge node voltage). Signal 522 illustrates the voltage at the first comparator input 124a over time. Signal 524 illustrates the voltage the comparator output 126 over time.

The pre-charging phase PC includes first period (e.g., a "charge" phase) and a second period (e.g., a "dump" phase). During the first period (e.g., from time T0 to time T1), the first pre-charge transistor 410 is "off" (e.g., non-conducting) (e.g., the first pre-charge control signal 508 at control terminal 414 is at a high voltage state for a p-channel transistor, like a pMOSFET), the second pre-charge transistor 416 is "on" (e.g., conducting)(e.g., the second pre-charge control signal 510 at control terminal 420 is at a low voltage state for a p-channel transistor, like a pMOSFET), the third pre-charge transistor 428 is "off" (e.g., the third pre-charge control signal 512 at control terminal 432 is at a low voltage state for an n-channel transistor, like an nMOSFET), the fourth pre-charge transistor 434 is "off" (e.g., the fourth pre-charge control signal 514 at control terminal 438 is at a low voltage state), the fifth pre-charge transistor 440 is "on" (e.g., the fifth pre-charge control signal 516 at control terminal 444 is at a high voltage state for an n-channel transistor, like an nMOSFET), and the reset transistor 130 is "on" (e.g., the reset signal 518 at the reset control terminal 134 is at a high voltage state). Thus, the first electrode 424 of capacitor 422 is coupled to the pre-charge source output 408 through the second pre-charge transistor 416 and the second electrode 426 of capacitor 422 is coupled to ground 120 through the fifth pre-charge transistor 440 and the reset transistor 130. As a result, current is provided to the first electrode 424 of capacitor 422 from the pre-charge source output 408. In response, capacitor 422 generates a positive voltage ramp at the first electrode 424 while the second electrode 426 is held at zero volts by ground 120.

During the second period (e.g., from time T1 to time T2), the first pre-charge transistor 410 switches "on" (e.g., the first pre-charge control signal 508 at control terminal 414 changes to a low voltage state), the second pre-charge transistor 416 switches "off" (e.g., the second pre-charge control signal 510 at control terminal 420 changes to a high voltage state), the third pre-charge transistor 428 switches "on" (e.g., the third pre-charge control signal 512 at control terminal 432 changes to a high voltage state), and the reset transistor 130 switches "off" (e.g., the reset signal 518 at the reset control terminal 134 changes to a low voltage state). Thus, the first electrode 424 of capacitor 422 is coupled to ground 120 through the third pre-charge transistor 428 while the second electrode 426 of capacitor 422 is isolated from ground 120 by the reset transistor 130 (and fourth pre-charge transistor 434) and coupled to the first comparator input 124a through the fifth pre-charge transistor 440. In response, capacitor 422 generates a negative voltage at second electrode 426 to maintain the voltage drop across capacitor 422. Further, a portion of the charge at capacitor 422 transfers to capacitor 114 until the capacitors 114, 422 become balanced. Thus, a negative voltage (e.g., the negative pre-charge voltage $-V_{PC}$) is generated at the first comparator input 124a by both capacitor 422 and capacitor 114.

After the second period of the pre-charging phase PC (e.g., during the first charging phase C1, the second charging phase C2, and the reset phase R), the fifth pre-charge transistor switches "off" (e.g., the fifth pre-charge control signal 516 at control terminal 444 changes to a low voltage state) and the fourth pre-charge transistor switches "on" (e.g., the fourth pre-charge control 514 at control terminal 438 changes to a high voltage state). Thus, the second electrode 426 of capacitor 422 is coupled to ground 120 through the fourth pre-charge transistor 434 and isolated from the charge node 112 by the fifth pre-charge transistor 440 while the first electrode 424 of capacitor 422 remains coupled to ground 120 through the third pre-charge transistor 428. In response, capacitor 422 is discharged (e.g., the voltage across capacitor 422 drops to zero).

The fourth pre-charge control signal 514 is an inverted and delayed copy of the fifth pre-charge control signal 516. The second pre-charge control signal 510 is an inverted copy of the first pre-charge control signal 508. The third pre-charge control signal 512 is a delayed copy of the second pre-charge control signal 510. In some examples, the fourth pre-charge control signal 514 is delayed relative to the fifth pre-charge control signal 516 so that the fourth pre-charge transistor 434 does not switch "on" before the fifth pre-charge transistor 440 switches "off" to avoid coupling the charge node 112 to ground 120 during the second period of the pre-charging phase PC. Further, the third pre-charge control signal 512 is delayed relative to the second pre-charge control signal 510 so that the third pre-charge transistor 428 does not switch "on" before the second pre-charge transistor 416 switches "off".

In some examples, the fourth pre-charge control signal 514, the fifth pre-charge control signal 516, and the reset signal 518 are at negative voltages $-V_{drive}$ (e.g., -300 millivolts or some other suitable value) when in their low voltage states (e.g., the low voltage states of these signals are equal to negative voltages instead of zero volts) to reduce a likelihood of charge loss at capacitor 114 and/or capacitor 422 due to reverse leakage at pre-charge transistor 434, pre-charge transistor 440, and/or reset transistor 130.

Figure 6:
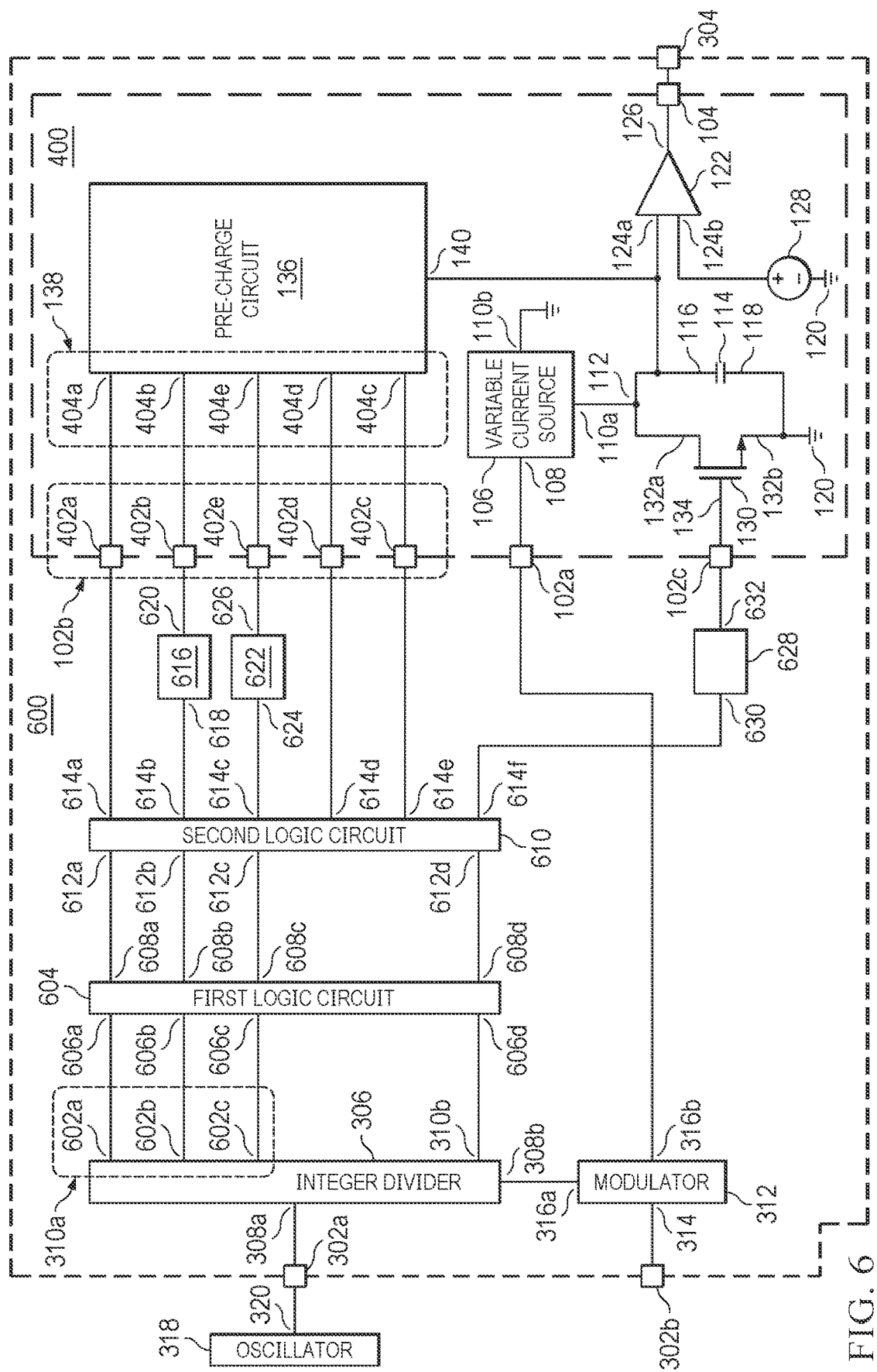
FIG. 6 is a circuit diagram of a fractional output divider (FOD) circuit including the DTC of FIG. 4.

FIG. 6 is a circuit diagram of a fractional output divider (FOD) circuit 600 including the DTC 400 of FIG. 4. The first divider output 310*a* includes divider output terminals 602*a*, 602*b* and 602*c*. Divider outputs terminals 602*a*-602*c* are coupled to DTC inputs terminals 402*a*, 402*b*, 402*e*, respectively.

In some examples, a first logic circuit 604 and a second logic circuit 610 are coupled between the first divider output 310*a* and the DTC pre-charge input 102*b*. The first logic circuit 604 has logic input terminals 606*a*, 606*b* and 606*c* and logic output terminals 608*a*, 608*b* and 608*c*. Logic input terminals 606*a*-606*c* are coupled to divider output terminals 602*a*-602*c*, respectively. The second logic circuit 610 has logic input terminals 612*a*, 612*b* and 612*c* and logic output terminals 614*a*, 614*b*, 614*c*, 614*d* and 614*e*. Logic input terminals 612*a*-612*c* are coupled to logic output terminals 608*a*-608*c*, respectively.

In some examples, a first negative driver circuit 616 and a second negative driver circuit 622 are coupled between the second logic circuit 610 and the DTC 100. For example, the first negative driver 616 has an input 618 coupled to logic output terminal 614*c* and an output 620 coupled to DTC input terminal 402*e*. The second negative driver 622 has an input 624 coupled to logic output terminal 614*d* and an output 626 coupled to DTC input terminal 402*d*.

In some examples, the first logic circuit 604 further includes logic input terminal 606*d* and logic output terminal 608*d*. Logic input terminal 606*d* is coupled to the second divider output 310*b*. In addition, the second logic circuit 610 includes logic input terminal 612*d* and logic output terminal 614*f*. Logic input terminal 612*d* is coupled to logic output terminal 608*d*.

In some examples, a third negative driver circuit 628 is coupled between the second logic circuit 610 and the DTC 100. The third negative driver 628 has an input 630 coupled to logic output terminal 614*f* and an output 632 coupled to the DTC reset input 102*c*.

Although the first logic circuit 604, the second logic circuit 610, and negative driver circuits 616, 622, 628 are shown as part of the FOD 600 and external to the DTC 400, in some examples, the first logic circuit 604, the second logic circuit 610, and negative driver circuits 616, 622, 628 are alternatively included in the DTC 400.

The integer divider 306 is configured to generate the first pre-charge control signal (e.g., 508 of FIG. 5), the second pre-charge control signal (e.g., 510 of FIG. 5), and the fifth pre-charge control signal (e.g., 516 of FIG. 5) based, at least in part, on the integer k. Further, the integer divider 306 is configured to output the aforementioned signals at the divider output terminals 602*a*-602*c*, respectively.

The first logic circuit 604 is configured to receive the first pre-charge control signal, the second pre-charge control signal, and the fifth pre-charge control signal at logic input terminals 606*a*-606*c*, respectively, from divider output terminals 602*a*-602*c*, respectively. In some examples, the first logic circuit 604 is configured to estimate and/or adjust a time delay of the aforementioned signals and output the signals (having adjusted delays) at logic output terminals 608*a*-608*c*, respectively, to achieve a desired phase synchronization between the signals.

The second logic circuit 610 is configured to receive the first pre-charge control signal, the second pre-charge control signal, and the fifth pre-charge control signal at logic input terminals 612*a*-612*c* from logic output terminals 608*a*-608*c*, respectively. The second logic circuit 610 is configured to output the aforementioned signals at logic output terminals 614*a*-614*c*, respectively. Further, the second logic circuit 610 is configured to generate the fourth pre-charge control signal (e.g., 514 of FIG. 5) based on the fifth pre-charge control signal and generate the third pre-charge control signal (e.g., 512 of FIG. 5) based on the second pre-charge control signal. In some examples, the second logic circuit 610 is configured to generate the fourth pre-charge control signal by delaying and inverting the fifth pre-charge control signal. In some examples, the second logic circuit 610 is configured to generate the third pre-charge control signal by delaying the second pre-charge control signal. The second logic circuit 610 is configured to output the fourth pre-charge control signal and the third pre-charge control signal at logic output terminals 614*d*, 614*e*, respectively.

The first negative driver 616 and the second negative driver 622 are configured to receive the fifth pre-charge control signal and the fourth pre-charge control signal at input 618, 624, respectively, from logic output terminals 614*c*, 614*d*, respectively. The first and second negative drivers 616, 622 are configured to adjust the low voltage states of the fifth pre-charge control signal and the fourth pre-charge control signal, respectively, from zero volts to the negative driver voltage $-V_{drive}$ ve to reduce a likelihood of charge loss at capacitor 114 and/or capacitor 422 due to reverse leakage at the fifth pre-charge transistor 440 and the fourth pre-charge transistor 434. The first and second negative drivers 616, 622 are configured to output the fifth and fourth pre-charge control signals (having the adjusted low voltage states) at outputs 620, 626, respectively.

DTC input terminals 402*a*, 402*b*, and 402*c* are configured to receive the first pre-charge control signal, the second pre-charge control signal, and the third pre-charge control signal from logic output terminals 614*a*, 614*b*, 614*e*, respectively. DTC input terminals 402*e*, 402*d* are configured to relieve the fifth pre-charge control signal and the fourth pre-charge control signal from outputs 620, 626, respectively.

The integer divider is configured to generate the reset signal (e.g., 518 of FIG. 5) based, at least in part, on the integer k. Further, the integer divider 306 is configured to output the reset signal at the second divider output 310*b*. The first logic circuit 604 is configured to receive the reset signal at logic input terminals 606*d* from the second divider output 310*b*. In some examples, the first logic circuit 604 is configured to estimate and/or adjust a gain of the reset signal and output the reset signal (having adjusted gain) at logic output terminals 608*d*. The second logic circuit 610 is configured to receive the reset signal at logic input terminal 612*d* from logic output terminals 608*d*. The second logic circuit 610 is configured to output the reset signal at logic output terminal 614*f*. The third negative driver 628 is configured to receive the reset signal at input 630 from logic output terminal 614*f*. The third negative driver 628 is configured to adjust the low voltage state of the reset signal from zero volts to the negative driver voltage $-V_{drive}$ to reduce a likelihood of charge loss at capacitors 114, 422 due to reverse leakage at the reset transistor 130. The third negative driver 628 is configured to output the reset signal (having the adjusted low voltage state) at output 632. The DTC reset input 102*c* is configured to receive the reset signal from output 632.

In some examples, the DTC 400 (FIG. 4) includes a substrate bias driver (not shown) that is configured to provide a negative bias (e.g., less than −500 millivolts or some other suitable value) to the substrate on which the pre-charge transistors (e.g., 410, 416, 428, 434, 440) are formed to avoid forward biasing of parasitic substrate diodes to minimize leakage current to the substrate.

Figure 7A:
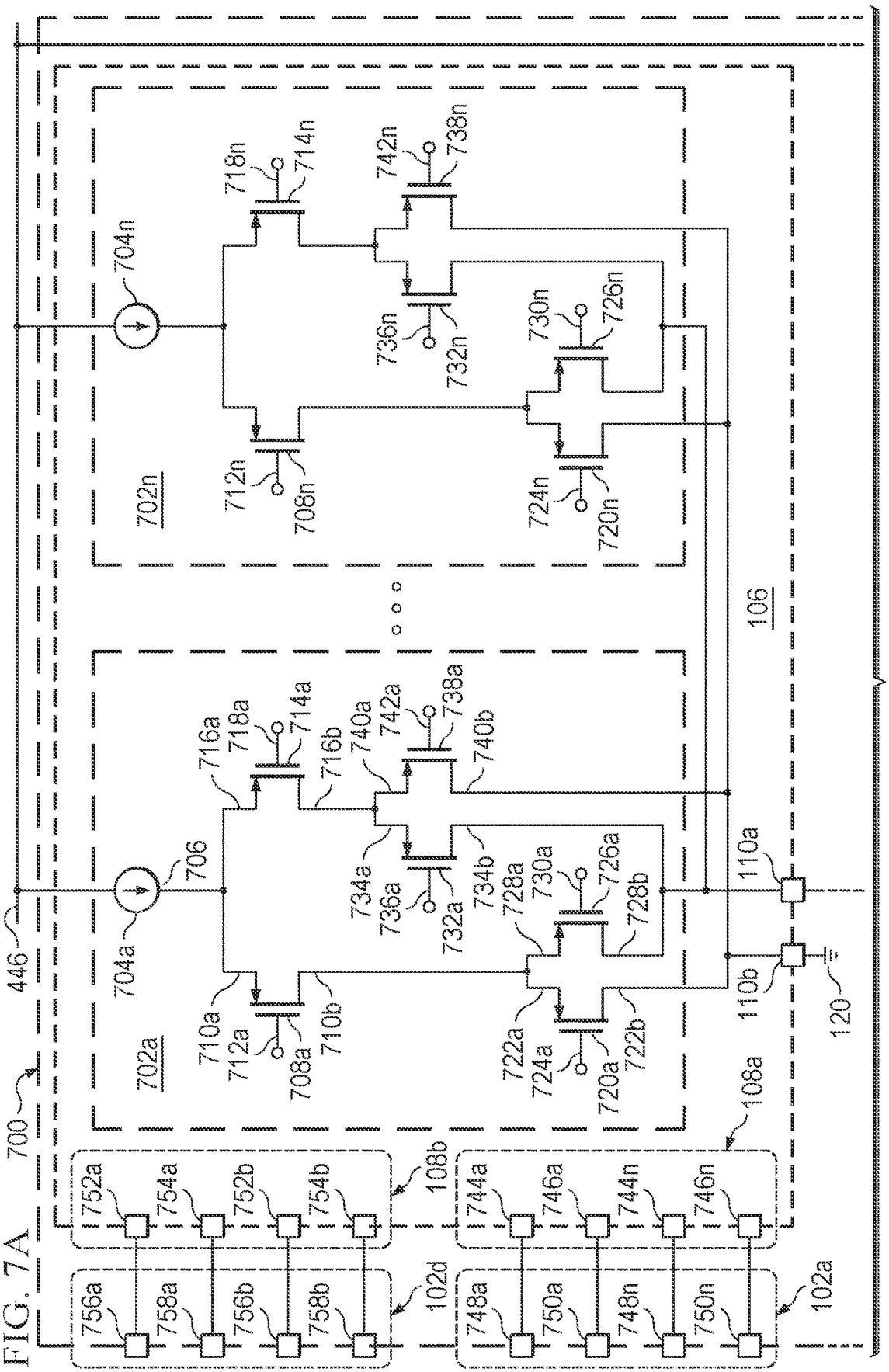
FIG. 7A and FIG. 7B are a circuit diagram of a DTC circuit.
Figure 7B:
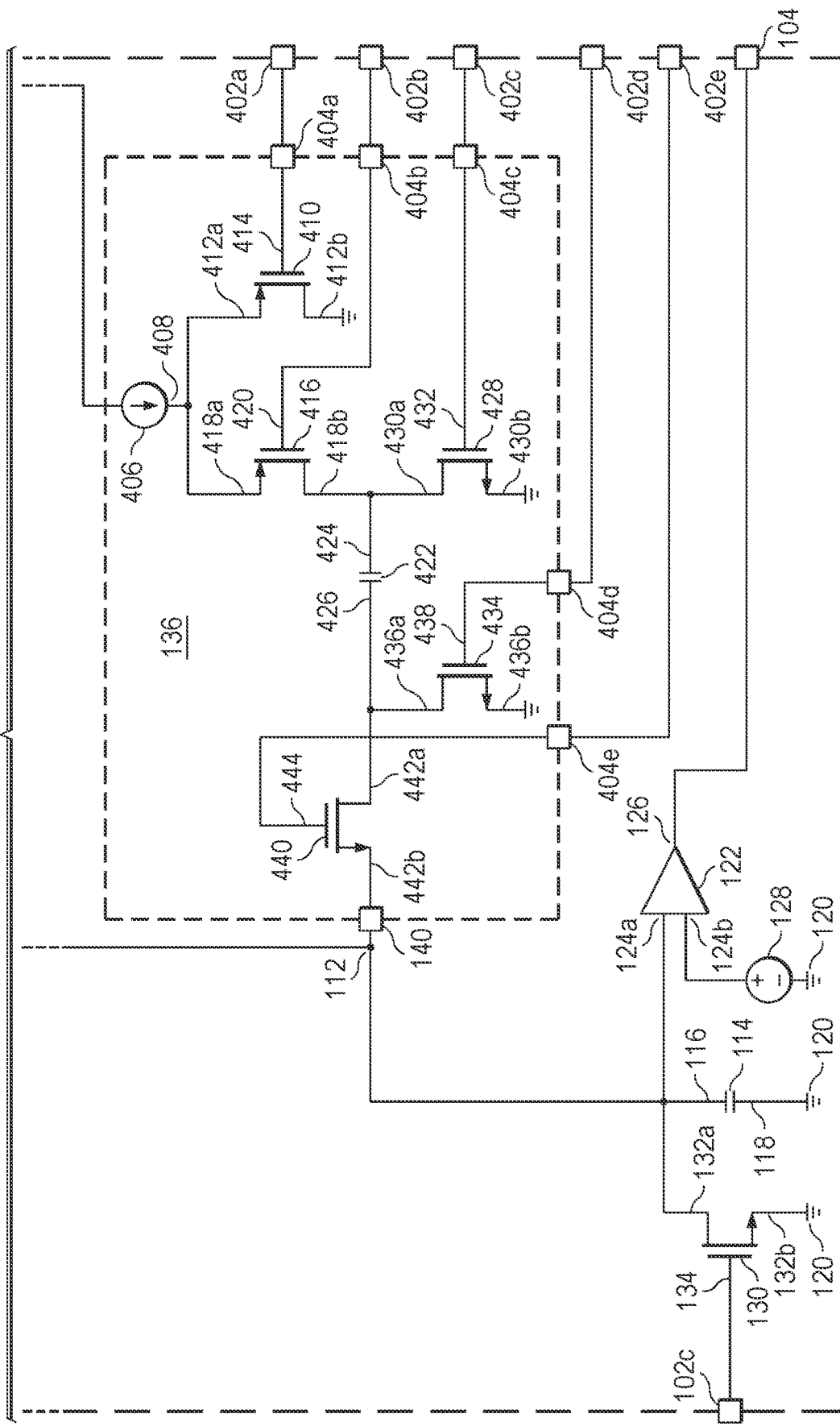

FIG. 7A and FIG. 7B are a circuit diagram of a DTC circuit 700 similar to the DTC circuit 400 of FIG. 4. In some examples, the variable current source 106 includes a plurality of current branches 702a-702n. For example, the variable current source 106 includes a first current branch 702a through an $N^{th}$ current branch 702n, where N is an integer greater than 1 (e.g., 2, 3, 4, etc.). Integer N corresponds to the number of bits in the digital value of the digital DTC input signal.

The current branches 702a-702n include current sources 704a-704n, first source transistors 708a-708n, second source transistors 714a-714n, third source transistors 720a-720n, fourth source transistors 726a-726n, fifth source transistors 732a-732n, and sixth source transistors 738a-738n, respectively. For example, the first current branch 702a includes current source 704a having an output 706. Current source 704a is coupled to the voltage supply terminal 446. First source transistor 708a has a first current terminal (e.g., a source) 710a coupled to the output 706 of current source 704a. Second source transistor 714a has a first current terminal (e.g., a source) 716a coupled to the output 706 of current source 704a. Third source transistor 720a has a first current terminal (e.g., a source) 722a coupled to a second current terminal (e.g., a drain) 710b of the first source transistor 708a and a second current terminal (e.g., a drain) 722b coupled to the second source output 110b. Fourth source transistor 726a has a first current terminal (e.g., source) 728a coupled to the second current terminal 710b of the first source transistor 708a and a second current terminal (e.g., a drain) 728b coupled to the first source output 110a. Fifth source transistor 732a has a first current terminal (e.g., a source) 734a coupled to a second current terminal (e.g., a drain) 716b of the second source transistor 714a and a second current terminal (e.g., drain) 734b coupled to the first source output 110a. Sixth source transistor 738a has a first current terminal (e.g., source) 740a coupled to the second current terminal 716b of the second source transistor 714a and a second current terminal (e.g., a drain) 740b coupled to the second source output 110b. The remaining source branches, including the $N^{th}$ current branch 702n, are arranged similarly to the first current branch 702a, as shown in FIG. 7A.

In some examples, the source input (e.g., 108 of FIG. 1 and FIG. 4) is a first source input 108a. The first source input 108a includes N non-inverted source input terminals 744a-744n and N inverted source input terminals 746a-746n. For example, the first source input 108a includes a first non-inverted source input terminal 744a through an $N^{th}$ non-inverted source input terminal 744n and a first inverted source input terminal 746a through an $N^{th}$ inverted source input terminal 746n.

Control terminals (e.g., transistor gates) 712a-712n of the first source transistors 708a-708n are coupled to the non-inverted source input terminals 744a-744n, respectively. For example, control terminal 712a of first source transistor 708a is coupled to non-inverted source input terminal 744a and control terminal 712n of first source transistor 708n is coupled to non-inverted source input terminal 744n. Further, control terminals (e.g., transistor gates) 718a-718n of the second source transistors 714a-714n are coupled to the inverted source input terminals 746a-746n. For example, control terminal 718a of second source transistor 714a is coupled to inverted source input terminal 746a and control terminal 718n of second source transistor 714n is coupled to inverted source input terminal 746n. The couplings between these terminals are not shown in FIG. 7A for simplicity of illustration.

The DTC digital input 102a includes N non-inverted DTC input terminals 748a-748n and N inverted DTC input terminals 750a-750n. For example, the DTC digital input 102a includes a first non-inverted DTC input terminal 748a through an $N^{th}$ non-inverted DTC input terminal 748n and a first inverted DTC input terminal 750a through an $N^{th}$ inverted DTC input terminal 750n. The non-inverted source input terminals 744a-744n are coupled to the non-inverted DTC input terminals 748a-748n, respectively, and the inverted source input terminals 746a-746n are coupled to the inverted DTC input terminals 750a-750n, respectively.

The N non-inverted DTC input terminals 748a-748n are configured to receive N non-inverted DTC digital input signals (e.g., 802a-802c of FIG. 8), respectively. The control terminals 712a-712n of source transistors 708a-708n are configured to receive the N non-inverted DTC digital input signals from the non-inverted DTC input terminals 748a-748n via the non-inverted source input terminals 744a-744n, respectively. For example, non-inverted DTC input terminal 748a is configured to receive a first non-inverted DTC digital input signal and non-inverted DTC input terminal 748n is configured to receive a $N^{th}$ non-inverted DTC digital input signal. Control terminal 712a of source transistor 708a is configured to receive the first non-inverted DTC digital input signal from non-inverted DTC input terminal 748a via non-inverted source input terminal 744a and control terminal 712n of source transistor 708n is configured to receive the $N^{th}$ non-inverted DTC digital input signal from non-inverted DTC input terminal 748n via non-inverted source input terminal 744n.

Similarly, the N inverted DTC input terminals 750a-750n are configured to receive N inverted DTC digital input signals (not shown), respectively. The control terminals 718-718n of source transistors 714a-714n are configured to receive the N inverted DTC digital input signals from the inverted DTC input terminals 750a-750n via the inverted source input terminals 746a-746n, respectively. For example, inverted DTC input terminal 750a is configured to receive a first inverted DTC digital input signal and inverted DTC input terminal 750n is configured to receive a $N^{th}$ inverted DTC digital input signal. Control terminal 718a of source transistor 714a is configured to receive the first inverted DTC digital input signal from inverted DTC input terminal 750a via inverted source input terminal 746a and control terminal 718n of source transistor 714n is configured to receive the $N^{th}$ inverted DTC digital input signal from inverted DTC input terminal 750n via inverted source input terminal 746n. The N inverted DTC input signals (not shown) are inverted copies of the N non-inverted DTC input signals (e.g., 802a-802c of FIG. 8), respectively.

In some examples, the variable current source 106 has a second source input 108b. The second source input 108b includes a pair of non-inverted source input terminals 752a, 752b and a pair of inverted source input terminals 754a, 754b.

Control terminals (e.g., transistor gates) 724a-724n of the third source transistors 720a-720n are coupled to non-inverted source input terminal 752a. For example, control terminal 724a of third source transistor 720a is coupled to non-inverted source input terminal 752a and control terminal 724n of first source transistor 720n is coupled to non-inverted source input terminal 752a.

Control terminals (e.g., transistor gates) 730a-730n of the fourth source transistors 726a-726n are coupled to inverted source input terminal 754a. For example, control terminal 730a of fourth source transistor 726a is coupled to inverted source input terminal 754a and control terminal 730n of fourth source transistor 726n is coupled to inverted source input terminal 754a.

Control terminals (e.g., transistor gates) 742a-742n of the sixth source transistors 738a-738n are coupled to non-inverted source input terminal 752b. For example, control terminal 742a of sixth source transistor 738a is coupled to non-inverted source input terminal 752b and control terminal 742n of sixth source transistor 738n is coupled to non-inverted source input terminal 752b.

Control terminals (e.g., transistor gates) 736a-736n of the fifth source transistors 732a-732n are coupled to inverted source input terminal 754b. For example, control terminal 736a of fifth source transistor 732a is coupled to inverted source input terminal 754b and control terminal 736n of fifth source transistor 732n is coupled to inverted source input terminal 754b. The couplings between these terminals are not shown in FIG. 7A for simplicity of illustration.

The DTC 400 includes a fourth DTC input 102d. The fourth DTC input 102d includes a pair of non-inverted DTC input terminals 756a, 756b and a pair of inverted DTC input terminals 758a, 758b. Non-inverted source input terminals 752a, 752b are coupled to the non-inverted DTC input terminals 756a, 756b, respectively, and inverted source input terminals 754a, 754b are coupled to inverted DTC input terminals 758a, 758b, respectively.

Figure 8:
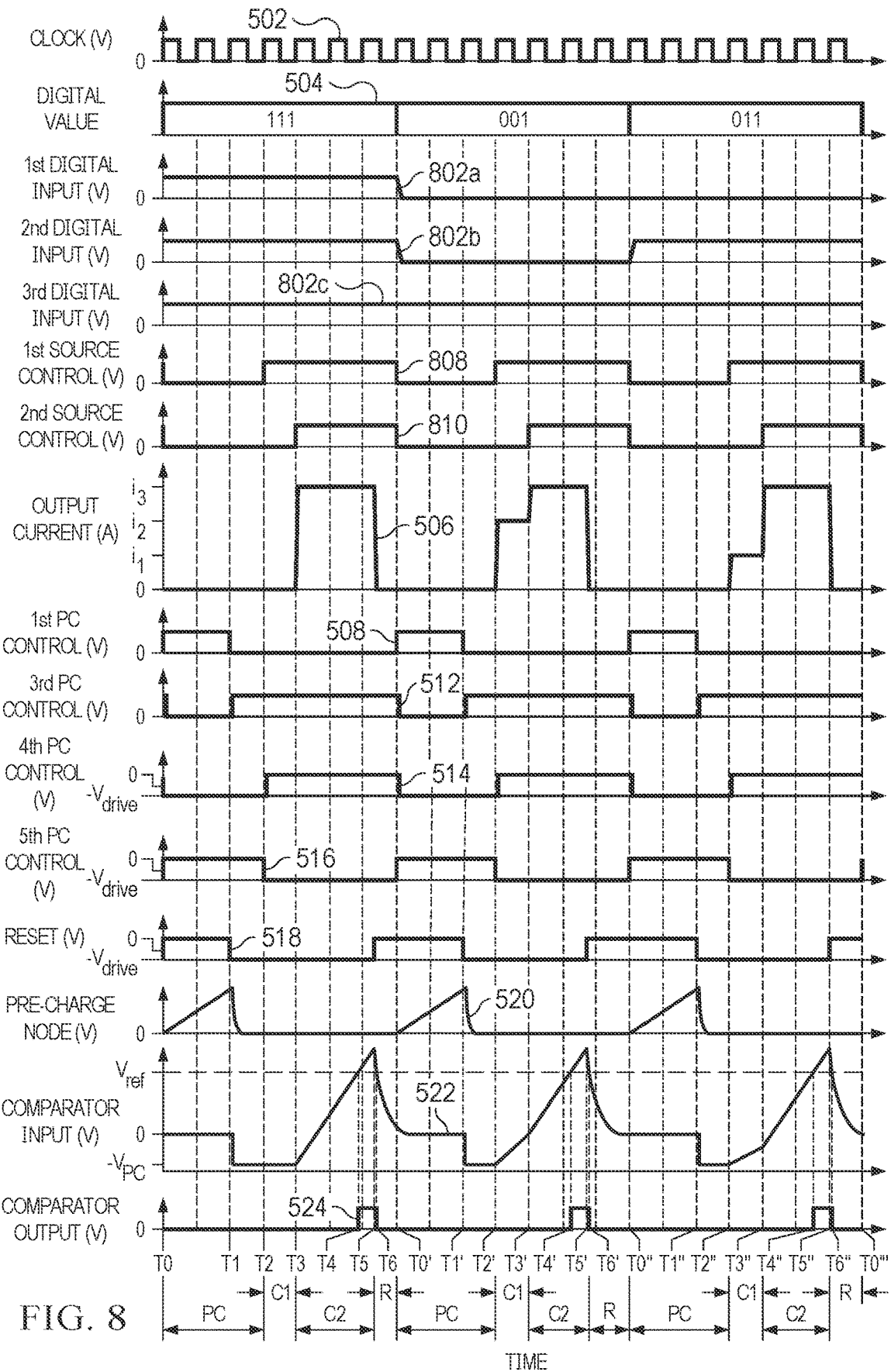
FIG. 8 is a timing diagram of the DTC of FIG. 7A and FIG. 7B.

Non-inverted DTC input terminal 756a is configured to receive a first non-inverted source control signal (e.g., 808 of FIG. 8). Control terminals (e.g., transistor gates) 724a-724n of source transistors 720a-720n are configured to receive the first non-inverted source control signal from non-inverted DTC input terminal 756a via non-inverted source input terminal 752a. Similarly, inverted DTC input terminal 758a is configured to receive an first inverted source control signal (not shown). Control terminals (e.g., transistor gates) 730a-730n of source transistors 726a-726n are configured to receive the first inverted source control signal from inverted DTC input terminal 758a via inverted source input terminal 754a. The first inverted source control signal (not shown) is an inverted copy of the first non-inverted source control signal (e.g., 808 of FIG. 8).

Non-inverted DTC input terminal 756b is configured to receive a second non-inverted source control signal (e.g., 810 of FIG. 8). Control terminals 742a-742n of source transistors 738a-738n are configured to receive the second non-inverted source control signal from non-inverted DTC input terminal 756b via non-inverted source input terminal 752b. Similarly, inverted DTC input terminal 758b is configured to receive a second inverted source control signal (not shown). Control terminals 736a-736n of source transistors 732a-732n are configured to receive the second inverted source control signal from inverted DTC input terminal 758b via inverted source input terminal 754b. The second inverted source control signal (not shown) is an inverted copy of the second non-inverted source control signal (e.g., 810 of FIG. 8).

FIG. 8 is a timing diagram of the DTC 700 of FIG. 7A and FIG. 7B. Referring to FIG. 7A, FIG. 7B, and FIG. 8, the digital DTC input signal corresponds to a digital value having N bits. In the example illustrated in FIG. 8, the digital DTC input signal corresponds to a digital value having three bits (e.g., N=3). Thus, in the example, digital DTC input 102a has three non-inverted DTC input terminals for receiving three non-inverted DTC digital input signals (e.g., first non-inverted DTC digital input signal 802a, second non-inverted DTC digital input signal 802b, and third non-inverted DTC digital input signal 802c) and three inverted DTC input terminals for receiving three inverted DTC digital input signals (e.g., a first inverted DTC digital input signal (not shown), a second inverted DTC digital input signal (not shown), and a third inverted DTC digital input signal (not shown)). The three inverted DTC digital input signals are inverted copies of the three non-inverted DTC digital input signals, respectively.

The three non-inverted DTC digital input signals correspond to the three bits of the digital value. In particular, the first non-inverted DTC digital input signal 802a corresponds to the first bit of the digital value, the second non-inverted DTC digital input signal 802b corresponds to the second bit of the digital value, and the third non-inverted DTC digital input signal corresponds to the third bit of the digital value. For example, when the digital value is 111, the first non-inverted DTC digital input signal 802a, the second non-inverted DTC digital input signal 802b, and the third non-inverted DTC digital input signal 802c are all at a high voltage state. When the digital value is 001, the first non-inverted DTC digital input signal and the second non-inverted DTC digital input signal are at a low voltage state while the third non-inverted DTC digital input signal is at the high voltage state. When the digital value is 011, the first non-inverted DTC digital input signal is at the low voltage state while the second and third non-inverted DTC digital input signals are at the high voltage state.

During the pre-charging phase PC (e.g., from time T0 to time T2), source transistors 726a-726n are "off" (e.g., the first non-inverted source control signal 808 is low) and source transistor 732a-732n are "off" (e.g., the second non-inverted source control signal 810 is low) so that no current is provided to the second source output 110b.

Subsequently, the first charging phase C1 begins (e.g., at time T2) when source transistors 726a-726n switch "on" (e.g., first non-inverted source control signal 808 goes high) and source transistors 732a-732n are "off" (e.g., second non-inverted source control signal 810 is low). During the first charging phase C 1, current branches receiving a low non-inverted DTC digital input signal provide the current from their respective current source to the first source output 110a. Further, current branches receiving a high non-inverted DTC digital input signal divert the current from their respective current source to the second source output 110b. Thus, a portion of the total current of the variable current source is provided to the charge node 112 while another portion of the total current of the variable current source 106 is diverted to ground during the first charging phase C1 according to the digital DTC input signal (the digital value).

For example, when the digital value is 111, the first non-inverted DTC digital input signal 802a is high (e.g., the voltage of supply conductor 446, around 1.8V to around 5V), the second non-inverted DTC digital input signal 802b is high, and the third non-inverted DTC digital input signal 802c is high. Accordingly, the first source transistor 708a of the first current branch 702a, the first source transistor (not shown) of the second current branch (not shown), and the first source transistor (e.g., 708n) of the third current branch (e.g., 702n) are "off". Further, the second source transistor 714a of the first current branch 702a, the second source transistor (not shown) of the second current branch (not shown), and the second source transistor (e.g., 714n) of the third current branch (e.g., 702n) are "on". Thus, the output 706 of the current source 704a of the first current branch 702a, the output of the current source (not shown) of the second current branch (not shown), and the output of the current source (e.g. 704n) of the third current branch (e.g., 702n) are each coupled to the second source output 110b via the second source transistor 714a and the sixth source transistor 738a of the first current branch 702a, the second source transistor (not shown) and the sixth source transistor (not shown) of the second current branch (not shown), and the second source transistor (e.g., 714n) and the sixth source transistor (e.g., 738n) of the third current branch (e.g., 702n).

When the digital value is 001, the first non-inverted DTC digital input signal 802a is low (e.g., around zero volts), the second non-inverted DTC digital input signal 802b is low, and the third non-inverted DTC digital input signal 802c is high. Accordingly, the first source transistor 708a of the first current branch 702a is "on", the first source transistor (not shown) of the second current branch (not shown) is "on", and the first source transistor (e.g., 708n) of the third current branch (e.g., 702n) is "off". Further, the second source transistors 714a of the first current branch 702a is "off", the second source transistor (not shown) of the second current branch (not shown) is "off", and the second source transistor (e.g., 714n) of the third current branch (e.g., 702n) is "on". Thus, the output 706 of current source 704a of the first current branch 702a and the output of the current source (not shown) of the second current branch (not shown) are both coupled to the first source output 110a by the first source transistor 708a and the fourth source transistor 726a of the first current branch 702a and by the first source transistor (not shown) and the fourth source transistor (not shown) of the second current branch (not shown). Further, the output of the current source (e.g., 704n) of the third current branch (e.g., 702n) is coupled to the second source output 110b by the second source transistor (e.g., 714n) and the sixth source transistor (e.g., 738n) of the third current branch (e.g., 702n).

When the digital value is 011, the first non-inverted DTC digital input signal 802a is low, the second non-inverted DTC digital input signal 802b is high, and the third non-inverted DTC digital input signal 802c is high. Accordingly, the first source transistor 708a of the first current branch 702a is "on", the first source transistor (not shown) of the second current branch (not shown) is "off", and the first source transistor (e.g. 708n) of the third current branch (e.g., 702n) is "off". Further, the second source transistor 714a of the first current branch 702a is "off", the second source transistor (not shown) of the second current branch (not shown) is "on", and the second source transistor (e.g., 714n) of the third current branch (e.g., 70n) is "on". Thus, the output of current source 704a of the first current branch 702a is coupled to the first source output 110a by the first source transistor 708a and the fourth source transistor 726a of the first current branch 702a, the output of the current source of the second current branch (not shown) is coupled to the second source output 110b by the second source transistor (not shown) and the fifth source transistor (not shown) of the second current branch (not shown), and the output of the current source (e.g. 704n) of the third current branch (e.g., 702n) is coupled to the second source output 110b by the second source transistor (e.g., 714n) and the sixth source transistor (e.g., 738n) of the third current branch (e.g., 702n).

In some examples, the number of possible current magnitudes (e.g., 0, $i_1$, $i_2$, $i_3$) during the first charging phase is equal to N+1. In particular, the possible current levels include a zero current level and N non-zero current levels. In some examples, the current magnitudes are evenly spaced apart.

Subsequently, the second charging phase C2 (e.g., at time T3) begins when source transistors 732a-732n switch "on" (e.g., the second non-inverted source control signal 810 drops high) and source transistors 726a-726n remain "on" (e.g., the first non-inverted source control signal 808 stays high). During the second changing phase C2, all of the current branches provide current from their respective current sources to the first source output 110a, regardless of the D signals, and none of the current branches divert current to the second source output 110b. For example, current source 704a of current branch 702a is coupled to the first source output 110a by source transistor 708a and source transistor 726a when the first D signal is low and current source 704a of current branch 702a is coupled to the first source output 110a by source transistor 714a and source transistor 732a when the first D signal is high. Thus, the currents from each of the current sources are provided to the charge node 112 while virtually no current is diverted to ground during the second charging phase C2. Thus, the current provided to the second source output 110b is independent of the digital DTC input signal during the second charging phase C2. The time between the rising edge of the first non-inverted source control signal and the rising edge of second non-inverted source control signal dictates the duration of the first charging phase C1.

Figure 9A:
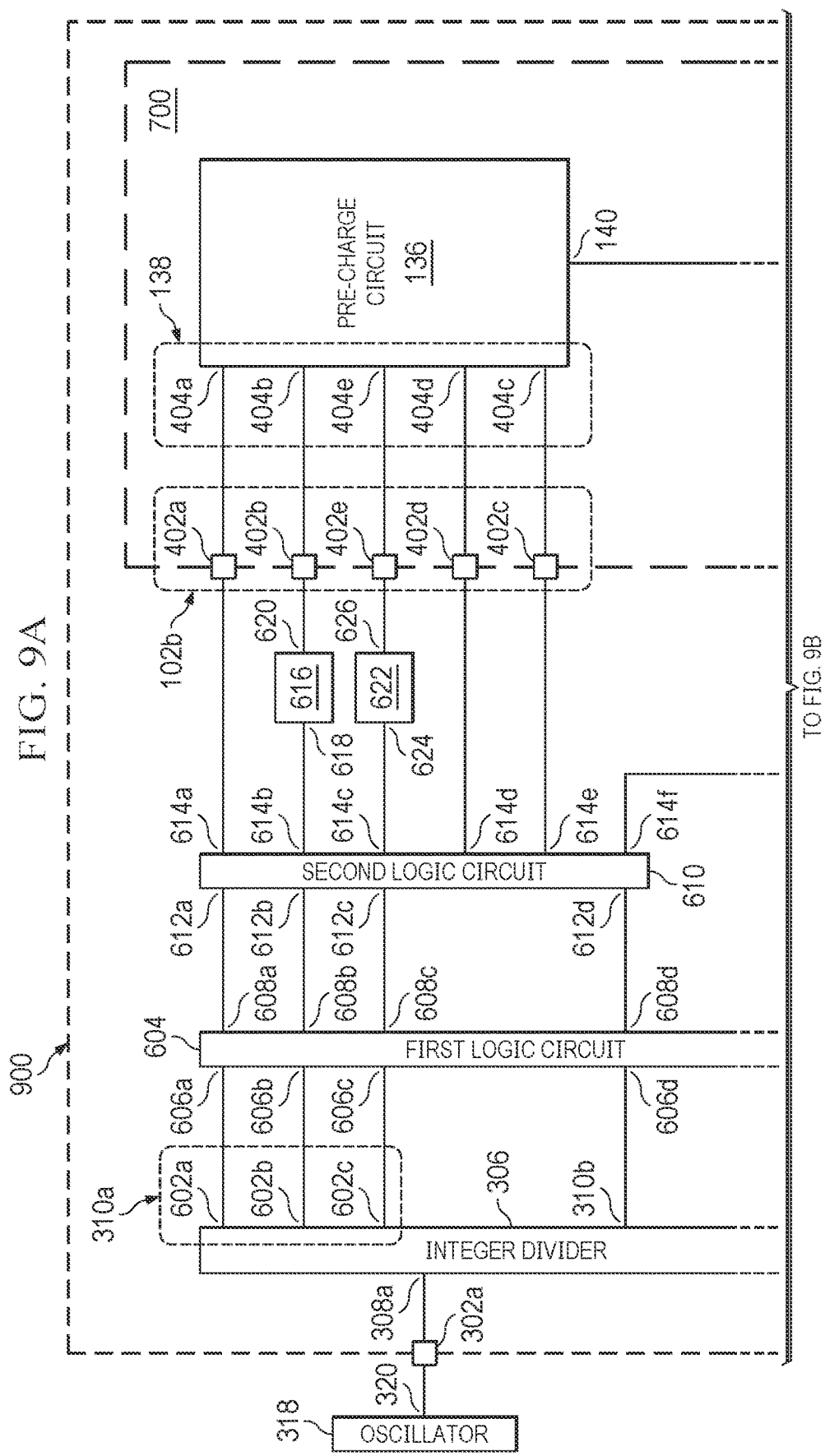
FIG. 9A and FIG. 9B are a circuit diagram of a fractional output divider (FOD) circuit including the DTC of FIG. 7A and FIG. 7B.
Figure 9B:
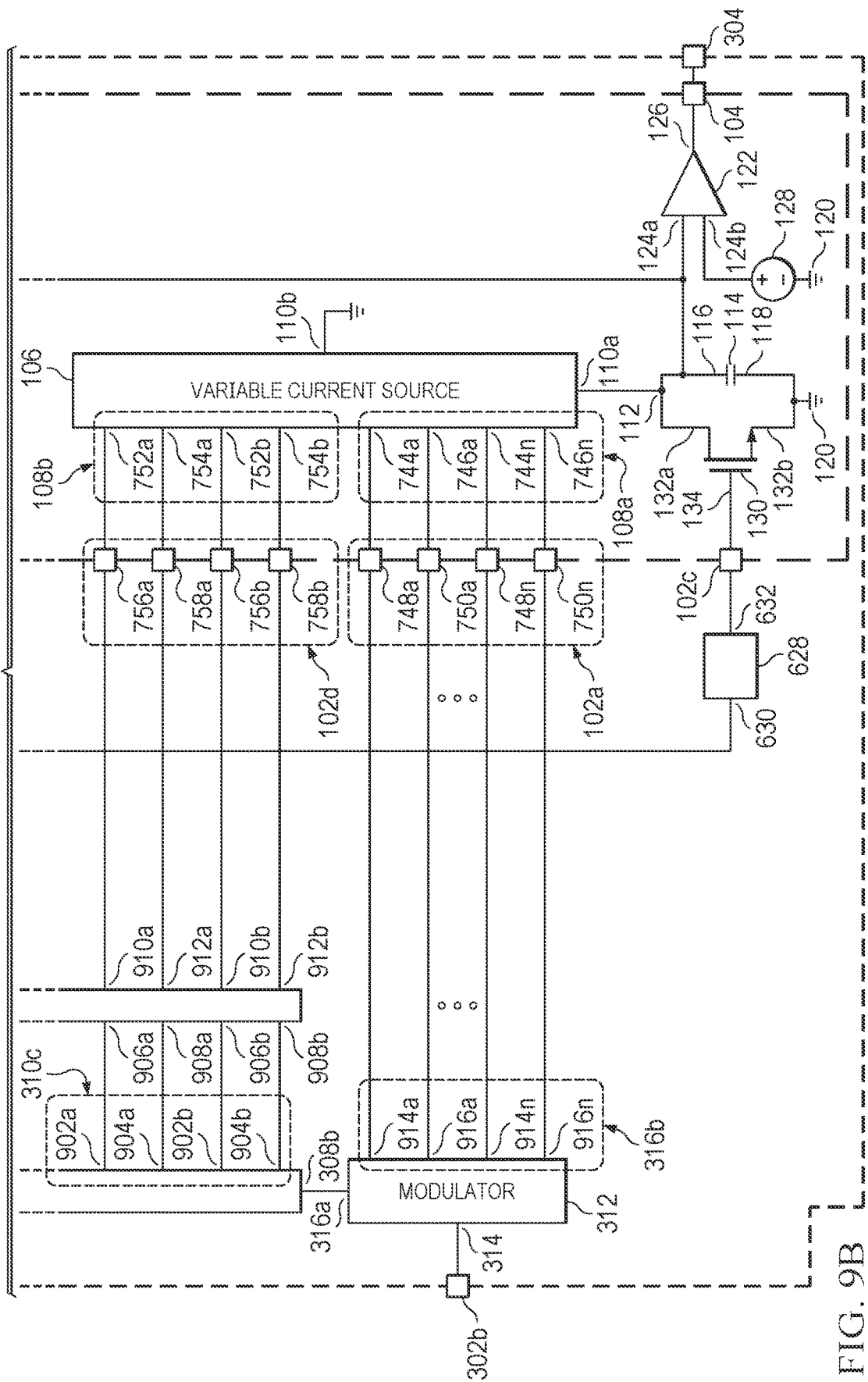

FIG. 9A and FIG. 9B are a circuit diagram of a fractional output divider (FOD) circuit 900 including the DTC 700 of FIG. 7A and FIG. 7B. The integer divider includes a third divider output 310c (e.g., a divider source output). The third divider output 310c includes a pair of non-inverted divider output terminals 902a, 902b and a pair of inverted divider output terminals 904a, 904b. In some examples, the first logic circuit 604 has non-inverted logic input terminals 906a, 906b, non-inverted logic output terminals 910a, 910b, inverted logic input terminals 908a, 908b, and inverted logic output terminals 912a, 912b. Non-inverted logic input terminals 906a, 906b are coupled to non-inverted divider output terminals 902a, 902b, respectively. Non-inverted logic output terminals 910a, 910b are coupled to non-inverted DTC input terminals 756a, 756b. Inverted logic input terminals 908a, 908b are coupled to inverted divider output terminals 904a, 904b, respectively. Inverted logic output terminals 912a, 912b are coupled to inverted DTC input terminals 758a, 758b.

In some examples, the second modulator output 316b includes N non-inverted modulator output terminals 914a-914n and N inverted modulator output terminals 916a-916n. For example, the second modulator output 316b includes a first non-inverted modulator output terminal 914a through an $N^{th}$ non-inverted modulator output terminal 914n and a first inverted modulator output terminal 916a through an $N^{th}$ inverted modulator output terminal 916n. The non-inverted modulator output terminals 914a-914n are coupled to non-inverted DTC input terminals 748a-748n. Inverted modulator output terminals 916a-916n are coupled to inverted DTC input terminals 750a-750n.

The integer divider 306 is configured to generate the first non-inverted source control signal and the second non-inverted source control signal based, at least in part, on the integer k. The integer divider 306 is configured to output the first non-inverted source control signal and the second non-inverted source control signal at non-inverted divider output terminals 902a, 902b, respectively. Further, the integer divider 306 is configured to generate the first inverted source control signal and the second inverted source control signal based on the first non-inverted source control signal and the second non-inverted source control signal, respectively. The integer divider is configured to output the first inverted source control signal and the second inverted source control signal at inverted divider output terminals 904a, 904b, respectively.

The first logic circuit 604 is configured to receive the first non-inverted source control signal and the second non-inverted source control signal at non-inverted logic input terminals 906a, 906b, respectively. In some examples, the first logic circuit 604 is configured to estimate and/or adjust a gain of the first and second non-inverted source control signals and output the signals (having adjusted gains) at non-inverted logic output terminals 910a, 910b, respectively. Similarly, the first logic circuit 604 is configured to receive the first inverted source control signal and the second inverted source control signal at inverted logic input terminals 908a, 908b, respectively. In some examples, the first logic circuit 604 is configured to estimate and/or adjust a gain of the first and second inverted source control signals and output the signals (having adjusted gains) at inverted logic output terminals 912a, 912b, respectively.

Non-inverted DTC input terminals 756a, 756b are configured to receive the first non-inverted source control signal and the second non-inverted source control signal from logic output terminals 910a, 910b, respectively. Similarly, inverted DTC input terminals 758a, 758b are configured to receive the first inverted source control signal and the second inverted source control signal from logic output terminals 912a, 912b, respectively.

The modulator 312 is configured to generate the N non-inverted DTC digital input signals based on the digital FOD input signal (corresponding to the digital value). Further, the modulator 312 is configured to output the N non-inverted DTC digital input signals at non-inverted modulator output terminals 914a-914n, respectively. Further, the modulator 312 is configured to generate the N inverted DTC digital input signals based on the N non-inverted DTC digital input signals, respectively. Further, the modulator 312 is configured to output the N inverted DTC digital input signals at inverted modulator output terminals 916a-916n, respectively.

Figure 10:
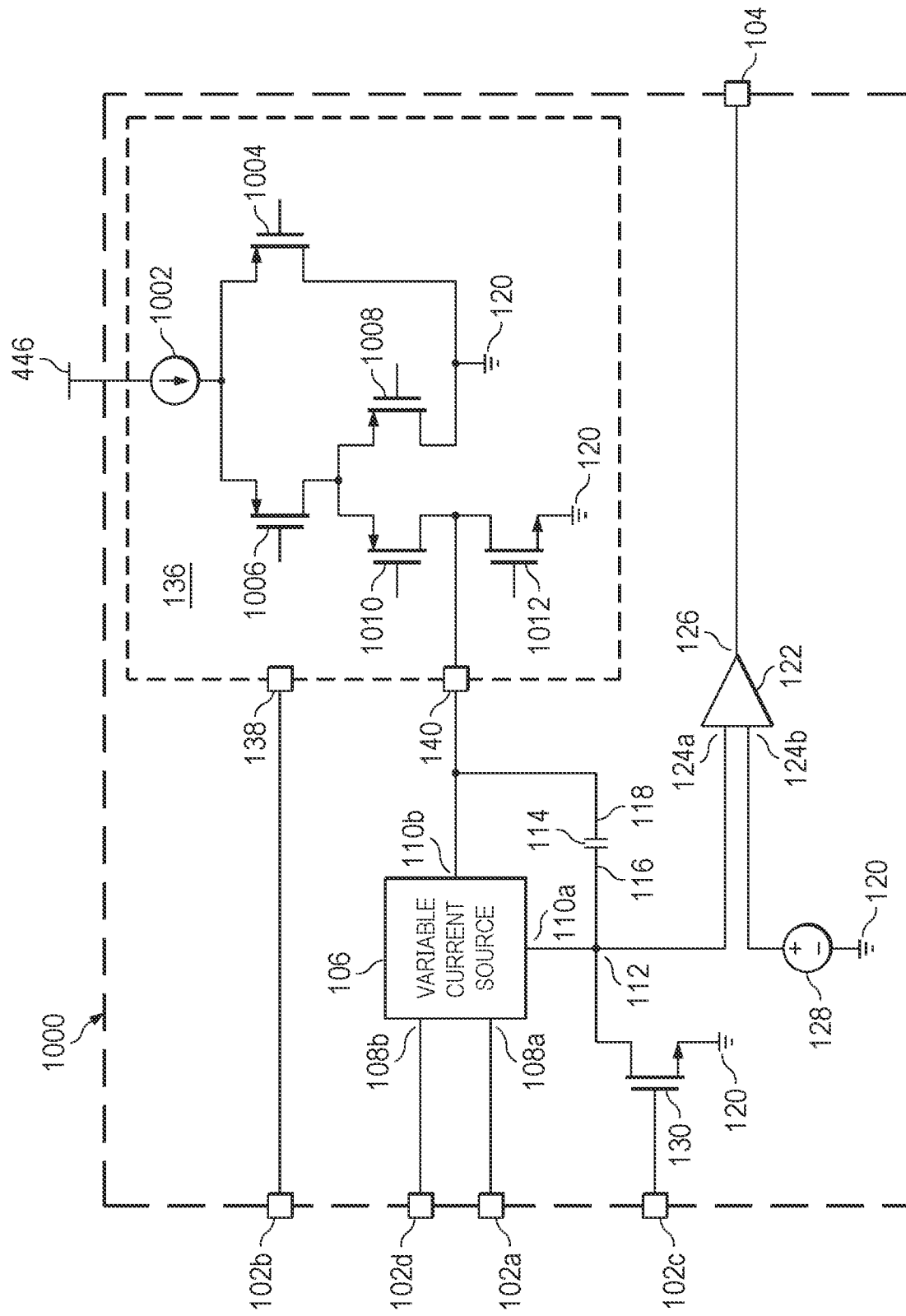
FIGS. 10, 11, 12 and 13 are circuit diagrams of various DTC circuits.

Non-inverted DTC input terminals 748a-748n are configured to receive the non-inverted DTC digital input signals from the non-inverted modulator output terminals 914a-914n, respectively. Further, inverted DTC input terminals 750a-750n are configured to receive the inverted DTC digital input signals from the inverted modulator output terminals 916a-916n, respectively FIG. 10 is a circuit diagram of an alternative DTC circuit 1000 similar to the DTC circuit 100 of FIG. 1. The pre-charge circuit 136 includes a pre-charge current source 1002. The pre-charge current source 1002 is coupled to a voltage supply terminal 446.

A first pre-charge transistor 1004 is coupled to the pre-charge current source 1002. The first pre-charge transistor 1004 has a first current terminal (not labeled) coupled to an output (not labeled) of the pre-charge current source 1002, a second current terminal (not labeled) coupled to ground 120, and a control terminal coupled to a first pre-charge control input terminal (not shown) at the pre-charge control input 138.

A second pre-charge transistor 1006 is coupled to the pre-charge current source 1002. The second pre-charge transistor 1006 has a first current terminal (not labeled) coupled to the output of the pre-charge current source 1002 and a control terminal (not labeled) coupled to a second pre-charge control input terminal (not shown) at the pre-charge control input 138.

A third pre-charge transistor 1008 is coupled to the second pre-charge transistor 1006. The third pre-charge transistor 1008 has a first current terminal (not labeled) coupled to a second current terminal (not labeled) of the second pre-charge transistor 1006, a second current terminal (not labeled) coupled to ground 120, and a control terminal (not labeled) coupled to a third pre-charge control input terminal (not shown) at the pre-charge control input 138.

A fourth pre-charge transistor 1010 is coupled to the second pre-charge transistor 1006. The fourth pre-charge transistor 1010 has a first current terminal (not labeled) coupled to the second current terminal of the second pre-charge transistor 1006, a second current terminal (not labeled) coupled to the pre-charge output 140, and a control terminal (not labeled) coupled to a fourth pre-charge control input terminal (not shown) at the pre-charge control input 138.

A fifth pre-charge transistor 1012 is coupled to the pre-charge output 140. The fifth pre-charge transistor 1012 has first current terminal (not labeled) coupled to the pre-charge output 140 and the second current terminal of the fourth pre-charge transistor 1010, a second current terminal (not labeled) coupled to ground 120, and a control terminal (not labeled) coupled to a fifth pre-charge control input terminal (not shown) at the pre-charge control input 138.

The pre-charge output 140 is coupled to the second electrode 118 of the capacitor 114. The second source output 110b is coupled to the second electrode 118 of the capacitor 114.

During a pre-charging phase, the variable current source 106 and the pre-charge circuit 136 are configured to provide current to the second electrode 118 of the capacitor 114 via the second source output 110b and the pre-charge output 140 to charge the capacitor 114 while the first electrode 116 of the capacitor 114 is coupled to ground 120 through the reset transistor 130. In response, the capacitor 114 generates a positive voltage at the second electrode 118. Pre-charge transistor 1012 is then switched "on" to couple the second electrode 118 of capacitor 114 to ground 120 and the reset transistor 130 is switched "off" to isolate the first electrode 116 of capacitor 114 from ground. In response, the capacitor 114 generates a negative voltage at the charge node 112 and the first comparator input 124a to maintain the voltage across the capacitor 114 after the switching.

Figure 11:
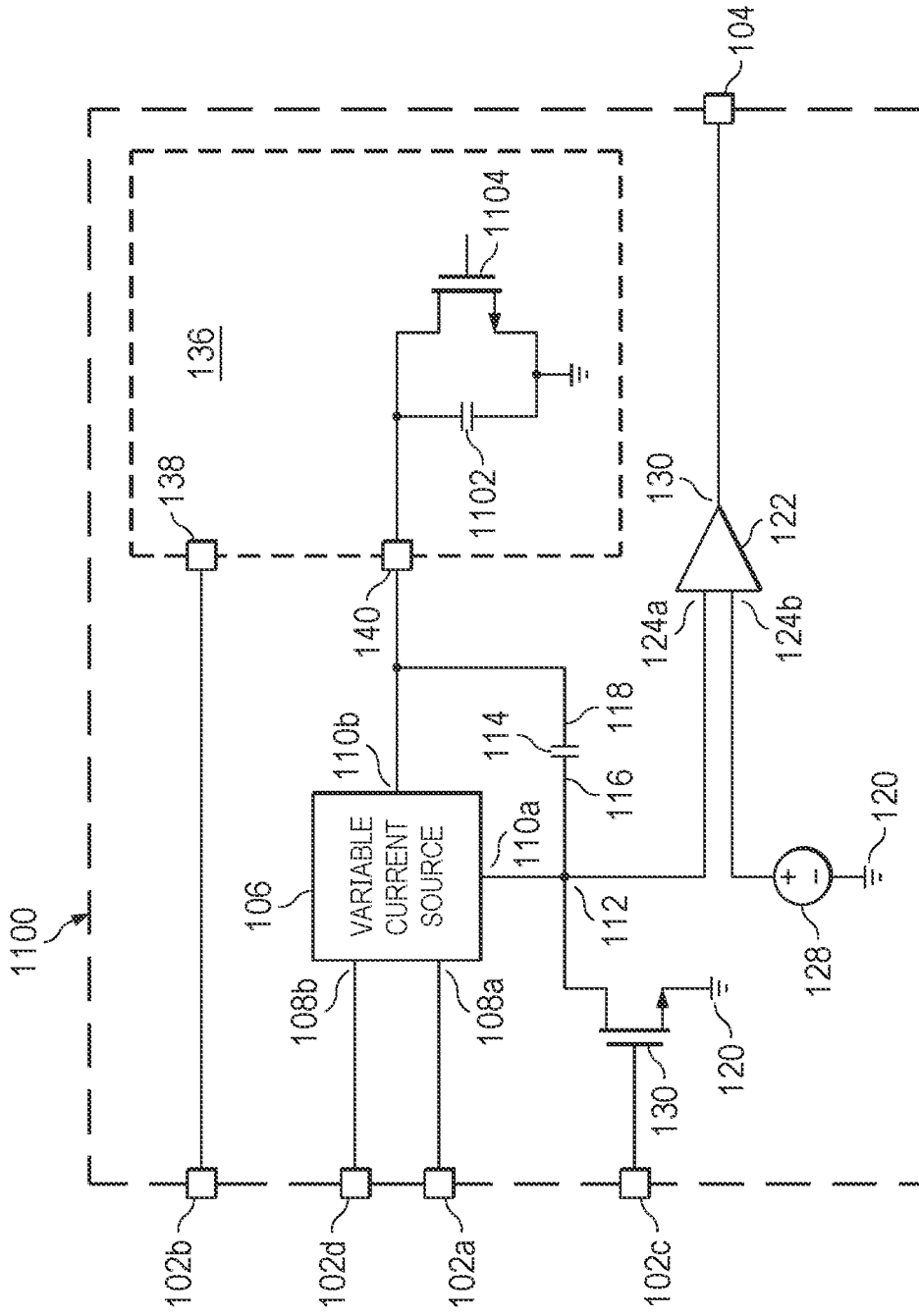

FIG. 11 is a circuit diagram of an alternative DTC circuit 1100 similar to the DTC circuit 100 of FIG. 1. The pre-charge circuit 136 includes a capacitor 1102 and a pre-charge transistor 1104. Capacitor 1102 has a first electrode (not labeled) coupled to the pre-charge output 140 and a second electrode (not labeled) coupled to ground 120. The pre-charge transistor 1104 has a first current terminal (not labeled) coupled to the pre-charge output 140, a second current terminal (not labeled) coupled to ground, and a control terminal (not labeled) coupled to the pre-charge control input 138. The pre-charge output 140 is coupled to the second electrode 118 of capacitor 114. The second source output 110b is coupled to the second electrode 118 of capacitor 114.

During a pre-charging phase, the variable current source 106 is configured to provide current to the second electrode 118 of the capacitor 114 via the second source output 110b to charge capacitor 114 while the first electrode 116 of capacitor 114 is coupled to ground 120 through the reset transistor 130. In response, capacitor 114 generates a positive voltage at the second electrode 118. Pre-charge transistor 1104 is then switched "on" to couple the second electrode 118 of capacitor 114 to ground and the reset transistor 130 is switched "off" to isolate the first electrode 116 of capacitor 114 from ground. In response, capacitor 114 generates a negative voltage at the charge node 112 and the first comparator input 124*a* to maintain the voltage across the capacitor 114 after the switching. Capacitor 1102 has an adjustable capacitance and is used to tune the voltage across capacitor 114 to a desired level.

Figure 12:
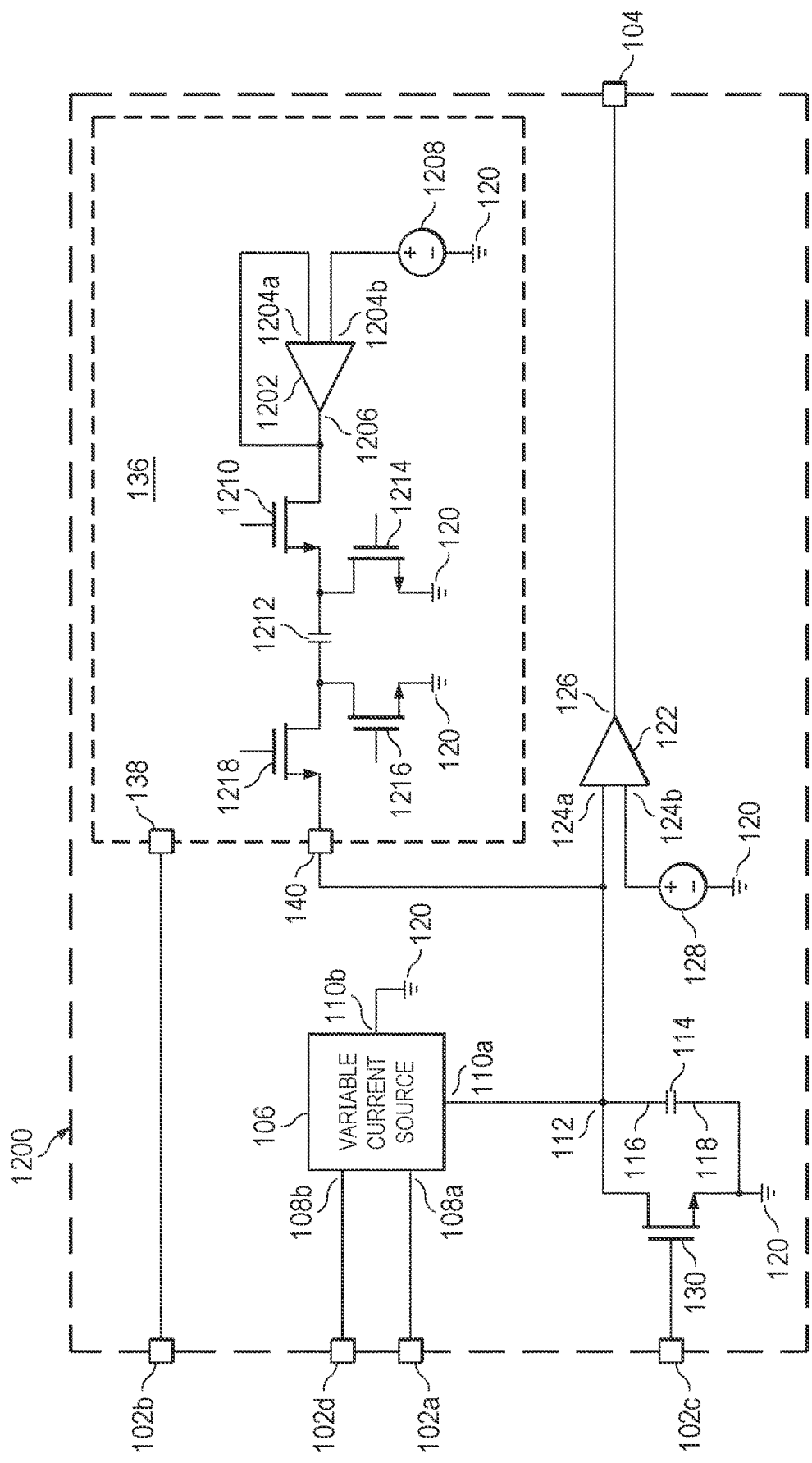

FIG. 12 is a circuit diagram of an alternative DTC circuit 1200 similar to the DTC circuit 100 of FIG. 1. The pre-charge circuit 136 includes a pre-charge amplifier 1202 having an inverting amplifier input 1204*a*, a non-inverting amplifier input 1204*b*, and an amplifier output 1206. The inverting amplifier input 1204*a* is coupled to the amplifier output 1206 and the non-inverting amplifier input 1204*b* is coupled to a voltage source 1208.

A first pre-charge transistor 1210 is coupled to the amplifier output 1206. The first pre-charge transistor 1210 has a first current terminal (not labeled) coupled to the amplifier output 1206 and a control terminal (not labeled) coupled to a first pre-charge control input terminal (not shown) at the pre-charge control input 138.

A capacitor 1212 is coupled to the first pre-charge transistor 1210. Capacitor 1212 has a first electrode (not labeled) coupled to the second current terminal of the first pre-charge transistor 1210.

A second pre-charge transistor 1214 is coupled to capacitor 1212 and the first pre-charge transistor 1210. The second pre-charge transistor 1214 has a first current terminal (not labeled) coupled to the first electrode of capacitor 1212, a second current terminal (not labeled) coupled to ground 120, and a control terminal (not labeled) coupled to a second pre-charge control input terminal (not shown) at the pre-charge control input 138.

A third pre-charge transistor 1216 is coupled to capacitor 1212. The third pre-charge transistor 1216 has a first current terminal (not labeled) coupled to a second electrode of capacitor 1212, a second current terminal (not labeled) coupled to ground 120, and a control terminal (not labeled) coupled to a third pre-charge control input terminal (not shown) at the pre-charge control input 138.

A fourth pre-charge transistor 1218 is coupled to capacitor 1212. The fourth pre-charge transistor 1218 has a first current terminal (not labeled) coupled to the second electrode of capacitor 1212, a second current terminal (not labeled) coupled to the pre-charge output 140, and a control terminal (not labeled) coupled to a fourth pre-charge control input terminal (not shown) at the pre-charge control input 138. The pre-charge output 140 is coupled to the charge node 112 and the first comparator input 124*a*. The second source output 110*b* is coupled to ground.

During a pre-charging phase, pre-charge transistor 1210 is "on" and pre-charge transistor 1214 is "off" to couple a first electrode of capacitor 1212 to the amplifier output 1206 to provide a positive voltage to the first electrode of capacitor 1212. Further, pre-charge transistor 1218 is "on" and pre-charge transistor 1216 is "off", and reset transistor 130 is "on" to couple a second electrode of capacitor 1212 to ground 120. Pre-charge transistor 1214 is then switched "on" and pre-charge transistor 1210 is switched "off" to couple the first electrode of capacitor 1212 to ground. Further, reset transistor 130 is switched "off" to isolate the second electrode of capacitor 1212 from ground 120. In response, capacitor 1212 generates a negative voltage at the first comparator input 124*a* to maintain the voltage across capacitor 1212 after the switching.

Figure 13:
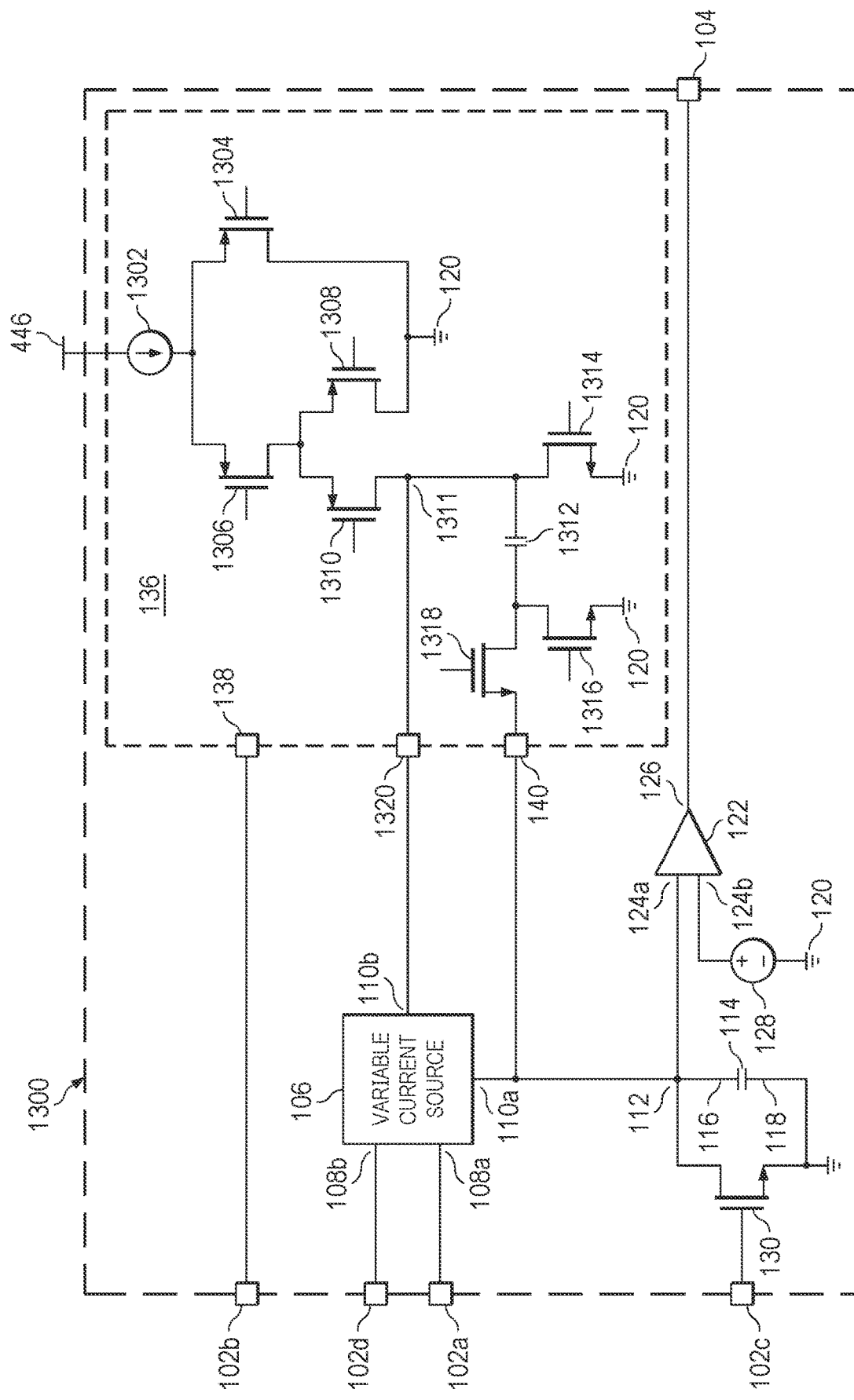

FIG. 13 is a circuit diagram of an alternative DTC circuit 1300 similar to the DTC circuit 100 of FIG. 1. The pre-charge circuit 136 includes a pre-charge current source 1302. The pre-charge current source 1302 is coupled to the voltage supply terminal 446.

A first pre-charge transistor 1304 is coupled to the pre-charge current source 1302. The first pre-charge transistor 1304 has first current terminal (not labeled) coupled to an output (not labeled) of the pre-charge current source 1302, a second current terminal (not labeled) coupled to ground 120, and a control terminal (not labeled) coupled to a first pre-charge control input terminal (not shown) at the pre-charge control input 138.

A second pre-charge transistor 1306 is coupled to the pre-charge current source 1302. The second pre-charge transistor 1306 has a first current terminal (not labeled) coupled to the output of the pre-charge current source 1302 and a control terminal (not labeled) coupled to a second pre-charge control input terminal (not shown) at the pre-charge control input 138.

A third pre-charge transistor 1308 is coupled to the second pre-charge transistor 1306. The third pre-charge transistor 1308 has a first current terminal (not labeled) coupled to a second current terminal (not labeled) of the second pre-charge transistor 1306, a second current terminal (not labeled) coupled to ground, and a control terminal (not labeled) coupled to a third pre-charge control input terminal (not shown) at the pre-charge control input 138.

A fourth pre-charge transistor 1310 is coupled to the second pre-charge transistor 1306. The fourth pre-charge transistor 1310 has a first current terminal (not labeled) coupled to the second current terminal of the second pre-charge transistor 1306, a second current terminal (not labeled) coupled to a pre-charge intermediate node 1311, and a control terminal (not labeled) coupled to a fourth pre-charge control input terminal (not shown) at the pre-charge control input 138.

A capacitor 1312 is coupled to the pre-charge intermediate node 1311. Capacitor 1312 has a first electrode (not labeled) coupled to the pre-charge intermediate node 1311.

A fifth pre-charge transistor 1314 is coupled to capacitor 1312. The fifth pre-charge transistor 1314 has a first current terminal (not labeled) coupled to the first terminal of capacitor 1312, a second current terminal (not labeled) coupled to ground 120, and a control terminal (not labeled) coupled to a fifth pre-charge control input terminal (not shown) at the pre-charge control input 138.

A sixth pre-charge transistor 1316 is coupled to capacitor 1312. The sixth pre-charge transistor 1316 has a first current terminal (not labeled) coupled to a second electrode (not labeled) of capacitor 1312, a second current terminal (not labeled) coupled to ground 120, and a control terminal (not labeled) coupled to a sixth pre-charge control input terminal (not shown) at the pre-charge control input 138.

A seventh pre-charge transistor 1318 is coupled to capacitor 1312. The seventh pre-charge transistor 1318 has a first current terminal (not labeled) coupled to the second electrode of capacitor 1312, a second current terminal (not labeled) coupled to the pre-charge output 140, and a control terminal (not labeled) coupled to a seventh pre-charge control input terminal (not shown) at the pre-charge control input 138.

The pre-charge output 140 is coupled to the charge node 112. The pre-charge circuit 136 has a current input 1320 coupled to the pre-charge intermediate node 1311. The second source output 110*b* is coupled to the current input 1320.

During a pre-charging phase, the variable current source 106 and the pre-charge current source 1302 are configured to provide current to a first electrode of capacitor 1312 via the second source output 110b and via pre-charge transistors 1306, 1310 to charge capacitor 1312 while a second electrode of capacitor 1312 is coupled to ground via pre-charge transistor 1318 and reset transistor 130. In response, capacitor 1312 generates a positive voltage at the first electrode. The first electrode of capacitor 1312 is then coupled to ground by pre-charge transistor 1314 and the reset transistor switches "off" to isolate the second electrode of capacitor 1312 from ground. In response, capacitor 1312 generates a negative voltage at the first comparator input 124a to maintain the voltage across the capacitor after the switching.

Figure 14:
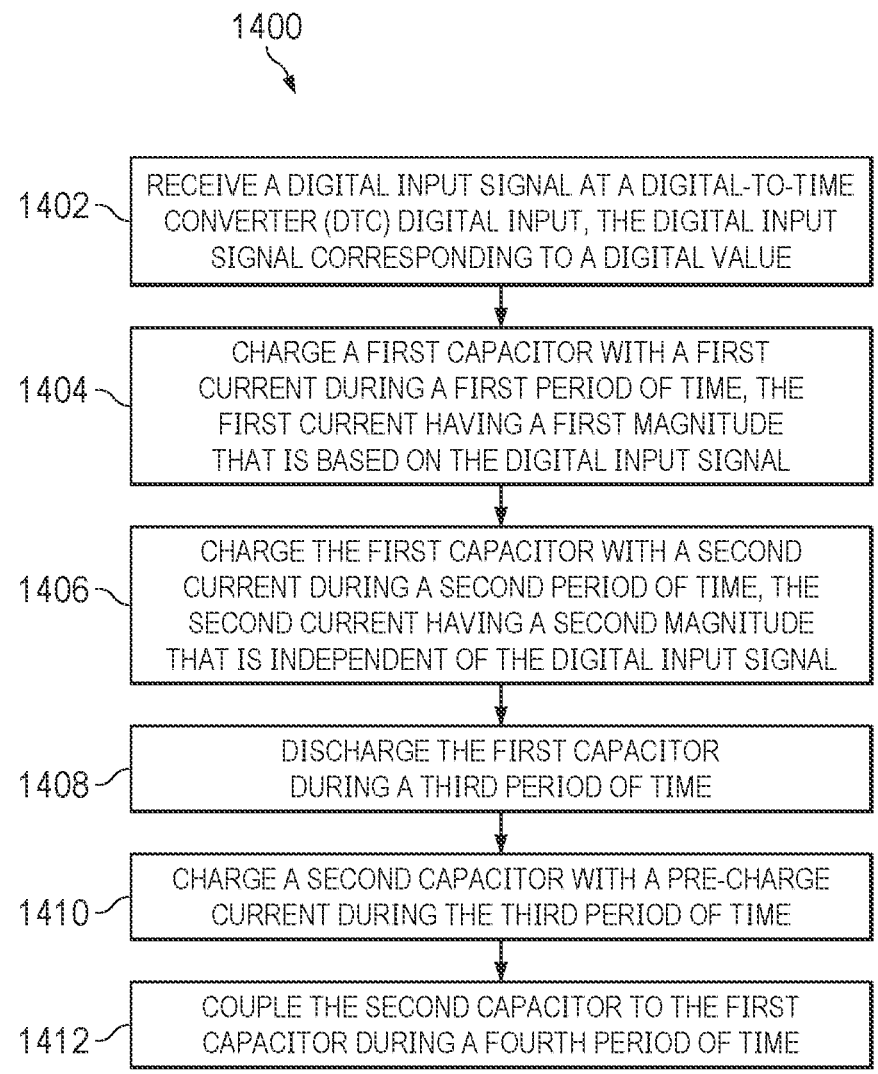
FIG. 14 is a flow diagram of a method for operating a DTC circuit.

FIG. 14 is a flow diagram of a method 1400 for operating a DTC circuit.

At block 1402, receive a digital input signal at a digital-to-time converter (DTC) digital input, the digital input signal corresponding to a digital value.

At block 1404, charge a first capacitor with a first current during a first period of time, the first current having a first magnitude that is based on the digital input signal. The first capacitor is coupled to an input of a comparator. The first capacitor generates a first voltage ramp at the input of the comparator during the first period of time.

At block 1406, charge the first capacitor with a second current during a second period of time, the second current having a second magnitude that is independent of the digital input signal. The first capacitor generates a second voltage ramp at the input of the comparator during the second period of time.

At block 1408, discharge the first capacitor during a third period of time.

At block 1410, charge a second capacitor with a pre-charge current during the third period of time.

At block 1412, couple the second capacitor to the first capacitor during a fourth period of time. In response, the second capacitor generates a negative pre-charge voltage at the input of the comparator during the fourth period of time.

The methods are illustrated and described above as a series of acts or events, but the illustrated ordering of such acts or events is not limiting. For example, some acts or events may occur in different orders and/or concurrently with other acts or events apart from those illustrated and/or described herein. Also, some illustrated acts or events are optional to implement one or more aspects or embodiments of this description. Further, one or more of the acts or events depicted herein may be performed in one or more separate acts and/or phases. In some embodiments, the methods described above may be implemented in a computer readable medium using instructions stored in a memory.

In this description, the term "couple" may cover connections, communications or signal paths that enable a functional relationship consistent with this description. Accordingly, if device A generates a signal to control device B to perform an action, then: (a) in a first example, device A is coupled directly to device B; or (b) in a second example, device A is coupled to device B through intervening component C if intervening component C does not substantially alter the functional relationship between device A and device B, so device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value, or, if the value is zero, a reasonable range of values around zero. Modifications are possible in the described examples, and other implementations are possible, within the scope of the claims.

What is claimed is:

1. A digital-to-time converter (DTC) circuit comprising:
a variable current source having a source output, the variable current source including a first transistor pair having first and second transistors and a second transistor pair having third and fourth transistors, in which a first terminal of the first transistor and a first terminal of the third transistor are coupled together, and a first terminal of the second transistor and a first terminal of the fourth transistor are coupled together and coupled to the source output;
a capacitor having a first capacitor terminal and a second capacitor terminal, the first capacitor terminal coupled to the source output;
a comparator having a first comparator input and a second comparator input, the first comparator input coupled to the source output; and
a pre-charge circuit having a pre-charge output, the pre-charge output coupled to the source output.

2. The DTC circuit of claim 1, wherein the second comparator input is configured to receive a positive voltage, and wherein the pre-charge circuit provides a negative voltage to the first comparator input.

3. The DTC circuit of claim 1, wherein the pre-charge output is coupled to the source output, and wherein the second capacitor terminal is coupled to ground.

4. The DTC circuit of claim 1, wherein the pre-charge output is coupled to the second capacitor terminal, wherein the source output is a first source output and the variable current source has a second source output, and wherein the second source output is coupled to the second capacitor terminal.

5. The DTC circuit of claim 1, wherein the capacitor is a first capacitor, wherein the pre-charge circuit comprises a second capacitor coupled to the pre-charge output.

6. The DTC circuit of claim 1, wherein the pre-charge circuit comprises a pre-charge current source having a pre-charge source output coupled to the pre-charge output.

7. The DTC circuit of claim 1, wherein the capacitor is a first capacitor, the pre-charge circuit comprising:
a pre-charge current source having an output;
a first pre-charge transistor having a first terminal and a second terminal, wherein the first terminal of the first pre-charge transistor is coupled to the output of the pre-charge current source, and the second terminal of the first pre-charge transistor is coupled to ground;
a second pre-charge transistor having a first terminal and a second terminal, wherein the first terminal of the second pre-charge transistor is coupled to the output of the pre-charge current source;
a second capacitor having a first terminal and a second terminal, wherein the first terminal of the second capacitor is coupled to the second terminal of the second pre-charge transistor;
a third pre-charge transistor having a first terminal and a second terminal, wherein the first terminal of the third pre-charge transistor is coupled to the first terminal of the second capacitor, and the second terminal of the third pre-charge transistor is coupled to ground;
a fourth pre-charge transistor having a first terminal and a second terminal, wherein the first terminal of the fourth pre-charge transistor is coupled to the second terminal of the second capacitor, and the second terminal of the fourth pre-charge transistor is coupled to ground; and
a fifth pre-charge transistor having a first terminal and a second terminal, wherein the first terminal of the fifth pre-charge transistor is coupled to the second terminal of the second capacitor, and the second terminal of the fifth pre-charge transistor is coupled to the coupled to the source output.

8. The DTC circuit of claim 1, wherein the source output is a first source output, the variable current source has a second source output, the second source output is coupled to the second capacitor terminal, and the pre-charge output is coupled to the second capacitor terminal, the pre-charge circuit comprising:
a pre-charge current source having a pre-charge source output;
a first pre-charge transistor coupled between the pre-charge source output and the pre-charge output; and
a second pre-charge transistor coupled between the pre-charge output and ground.

9. The DTC circuit of claim 1, wherein the capacitor is a first capacitor, the source output is a first source output, the variable current source has a second source output, the second source output is coupled to the second capacitor terminal, and the pre-charge output is coupled to the second capacitor terminal, the pre-charge circuit comprising:
a second capacitor having a third capacitor terminal and a fourth capacitor terminal, wherein the third capacitor terminal is coupled to the pre-charge output and the fourth capacitor terminal is coupled to ground; and
a pre-charge transistor coupled between pre-charge output and ground.

10. The DTC circuit of claim 1, wherein the capacitor is a first capacitor, the pre-charge output is coupled to the source output, and the second capacitor terminal is coupled to ground, the pre-charge circuit comprising:
a pre-charge amplifier having an inverting amplifier input, a non-inverting amplifier input, and an amplifier output, wherein the inverting amplifier input is coupled to the amplifier output, and the non-inverting amplifier input is coupled to a pre-charge voltage source terminal;
a second capacitor having a third capacitor terminal and a fourth capacitor terminal;
a first pre-charge transistor coupled between the amplifier output and the third capacitor terminal;
a second pre-charge transistor coupled between the third capacitor terminal and ground;
a third pre-charge transistor coupled between the fourth capacitor terminal and ground; and
a fourth pre-charge transistor coupled between the fourth capacitor terminal and the pre-charge output.

11. The DTC circuit of claim 1, wherein the capacitor is a first capacitor, the source output is a first source output, the variable current source has a second source output, and the pre-charge circuit has a current input coupled to the second source output, and the pre-charge output is coupled to the source output, the pre-charge circuit comprising:
a pre-charge current source having a pre-charge source output;
a first pre-charge transistor coupled between the pre-charge source output and the current input;
a second capacitor having a third capacitor terminal and a fourth capacitor terminal, wherein the third capacitor terminal is coupled to the first pre-charge transistor and the current input;
a second pre-charge transistor coupled between the third capacitor terminal and ground; a third pre-charge transistor coupled between the fourth capacitor terminal and ground; and a fourth pre-charge transistor coupled between the fourth capacitor terminal and the pre-charge output.

12. The DTC circuit of claim 1, further comprising:
a reset transistor having a first terminal and a second terminal, wherein the first terminal of the reset transistor is coupled to the charge node, and the second terminal of the reset transistor is coupled to ground, and the control terminal of the reset transistor is coupled to a reset control terminal.

13. A fractional output divider (FOD) circuit comprising:
an integer divider circuit having a first divider input, a second divider input, and a first divider output;
a modulator circuit having a first modulator output, and a second modulator output, the first modulator output is coupled to the second divider input; and
digital-to-time converter (DTC) circuit having a DTC digital input, a DTC pre-charge input, and a DTC output, the DTC digital input is coupled to the second modulator output and the DTC pre-charge input is coupled to the first divider output, the DTC circuit comprising:
  a variable current source having a source input and a source output, the source input is coupled to the DTC digital input;
  a capacitor having a first capacitor terminal and a second capacitor terminal, the first capacitor terminal coupled to the source output;
  a comparator having a first comparator input, a second comparator input, and a comparator output, the first comparator input is coupled to the source output, the second comparator input is coupled to a first voltage terminal, and the comparator output is coupled to the DTC output; and
  a pre-charge circuit having a pre-charge output, the pre-charge output is coupled to the capacitor.

14. The FOD circuit of claim 13, further comprising:
a first logic circuit coupled between the first divider output and the DTC pre-charge input.

15. The FOD circuit of claim 14, the FOD further comprising:
a second logic circuit coupled between the first logic circuit and the DTC pre-charge input.

16. The FOD circuit of claim 15, further comprising:
a negative driver circuit coupled between second logic circuit and the DTC pre-charge input.

17. The FOD circuit of claim 16, wherein the DTC circuit has a DTC reset input and the integer divider circuit has a second divider output, wherein the first logic circuit is coupled between the second divider output and the second logic circuit, and wherein the second logic circuit is coupled between the first logic circuit and the DTC reset input, the DTC circuit further comprising:
a reset transistor coupled between the source output and ground, the reset transistor having a reset control terminal coupled to the DTC reset input.

18. The FOD circuit of claim 17, wherein the negative driver circuit is a first negative driver circuit, the FOD further comprising:
a second negative driver circuit coupled between the second logic circuit and the DTC reset input.

19. The FOD circuit of claim 13, wherein the first divider input is coupled to an output of an oscillator via the FOD clock input.

20. A method comprising:
receiving a digital input signal at a digital-to-time converter (DTC) digital input, the digital input signal corresponding to a digital value;
charging a first capacitor with a current during a first period of time to generate a first voltage ramp at a first terminal of the first capacitor, wherein a magnitude of the current during the first period of time corresponds to the digital input signal, and wherein the first terminal of the first capacitor is coupled to an input of a comparator;
charging the first capacitor with the current during a second period of time to generate a second voltage ramp at the first terminal of the first capacitor, wherein the magnitude of the current during the second period of time is independent of the digital input signal;
discharging the first capacitor during a third period of time;
charging a second capacitor with a pre-charge current during the third period of time to generate a positive pre-charge voltage at a first terminal of the second capacitor; and
coupling a second terminal of the second capacitor to the input of the comparator during a fourth period of time to generate a negative pre-charge voltage at the input of the comparator during the fourth period of time.

* * * * *